United States Patent
Kijima et al.

(10) Patent No.: US 9,966,527 B2
(45) Date of Patent: May 8, 2018

(54) PBNZT FERROELECTRIC FILM, SOL-GEL SOLUTION, FILM FORMING METHOD AND METHOD FOR PRODUCING FERROELECTRIC FILM

(71) Applicant: YOUTEC CO., LTD., Chiba (JP)

(72) Inventors: Takeshi Kijima, Chiba (JP); Yuuji Honda, Chiba (JP)

(73) Assignee: YOUTEC CO., LTD., Chiba (JP)

( * ) Notice: Subject to any disclaimer, the term of this patent is extended or adjusted under 35 U.S.C. 154(b) by 0 days. days.

(21) Appl. No.: 15/215,879

(22) Filed: Jul. 21, 2016

(65) Prior Publication Data

US 2016/0329485 A1    Nov. 10, 2016

Related U.S. Application Data

(62) Division of application No. 13/522,824, filed as application No. PCT/JP2010/062864 on Jul. 23, 2010, now Pat. No. 9,431,242.

(30) Foreign Application Priority Data

Jan. 21, 2010 (JP) .................................. 2010-011187

(51) Int. Cl.
*H01L 41/39* (2013.01)
*C01G 23/00* (2006.01)
(Continued)

(52) U.S. Cl.
CPC ............ *H01L 41/39* (2013.01); *C01G 23/003* (2013.01); *C01G 33/006* (2013.01);
(Continued)

(58) Field of Classification Search
CPC . C23C 18/1254; C23C 18/1216; C01G 25/02; C01G 33/00
(Continued)

(56) References Cited

U.S. PATENT DOCUMENTS 5,271,797 A * 12/1993 Kamisawa .............. C23C 18/06
216/101
6,518,168 B1 * 2/2003 Clem ................ H01L 21/76898
257/E21.171

(Continued)

FOREIGN PATENT DOCUMENTS

| JP | 60-236404 | 11/1985 |
|----|-----------|---------|
| JP | 07-252664 | 10/1995 |

(Continued)

OTHER PUBLICATIONS

International Search Report dated Nov. 22, 2010 in International (PCT) Application No. PCT/JP2010/062864.
(Continued)

*Primary Examiner* — Michael A Salvitti
(74) *Attorney, Agent, or Firm* — Wenderoth, Lind & Ponack, L.L.P.

(57) ABSTRACT

To provide a PBNZT ferroelectric film capable of preventing sufficiently oxygen ion deficiency. The PBNZT ferroelectric film according to an embodiment of the present invention is a ferroelectric film including a perovskite-structured ferroelectric substance represented by $ABO_3$, wherein the perovskite-structured ferroelectric substance is a PZT-based ferroelectric substance containing $Pb^{2+}$ as A-site ions and containing $Zr^{4+}$ and $Ti^{4+}$ as B-site ions, and the A-site contains $Bi^{3+}$ as A-site compensation ions and the B-site contains $Nb^{5+}$ as B-site compensation ions.

21 Claims, 11 Drawing Sheets

COMPARISON OF HYSTERESIS BEHAVIOR BETWEEN PRESENT INVENTION AND Si-ADDED PZT

(51) Int. Cl.
  *C01G 33/00* (2006.01)
  *C23C 18/12* (2006.01)
  *H01L 21/02* (2006.01)
  *H01L 41/187* (2006.01)
(52) U.S. Cl.
  CPC ...... *C23C 18/1216* (2013.01); *C23C 18/1225* (2013.01); *C23C 18/1254* (2013.01); *C23C 18/1295* (2013.01); *H01L 21/02197* (2013.01); *H01L 21/02282* (2013.01); *H01L 41/187* (2013.01)
(58) Field of Classification Search
  USPC ................................. 252/507, 62.9; 516/33
  See application file for complete search history.

(56) References Cited

U.S. PATENT DOCUMENTS

| | | | |
|---|---|---|---|
| 7,102,274 | B2 | 9/2006 | Kita |
| 7,348,715 | B2 | 3/2008 | Torii et al. |
| 7,820,723 | B2 * | 10/2010 | Belleville ............ C01G 23/003 106/287.19 |
| 9,431,242 | B2 * | 8/2016 | Kijima ................. C01G 23/003 |
| 2005/0162047 | A1 * | 7/2005 | Torii ........................ B41J 2/161 310/358 |
| 2005/0218437 | A1 * | 10/2005 | Ueno ................. C23C 18/1216 257/295 |
| 2006/0138382 | A1 * | 6/2006 | Kijima ................. C01G 33/006 252/62.9 PZ |
| 2006/0138507 | A1 * | 6/2006 | Kijima ................. C04B 35/493 257/295 |
| 2007/0097182 | A1 * | 5/2007 | Kubota ............... B41J 2/14233 347/70 |
| 2009/0062114 | A1 * | 3/2009 | Arakawa ............. B41J 2/14233 502/232 |
| 2010/0208005 | A1 | 8/2010 | Fujii et al. |
| 2010/0255611 | A1 | 10/2010 | Wang |
| 2011/0098173 | A1 * | 4/2011 | Fujii .................... C01G 25/006 501/134 |
| 2011/0205307 | A1 * | 8/2011 | Ueda ................... B41J 2/14233 347/68 |
| 2012/0141915 | A1 * | 6/2012 | Sahu ......................... C08J 5/22 429/494 |
| 2013/0022839 | A1 * | 1/2013 | Kijima ................. C01G 23/003 428/701 |
| 2013/0165313 | A1 * | 6/2013 | Kijima ................. C01G 23/002 501/135 |
| 2014/0225317 | A1 * | 8/2014 | Kijima ................. C01G 33/006 264/613 |
| 2014/0242379 | A1 * | 8/2014 | Kijima ................ H01L 41/0815 428/332 |
| 2015/0307403 | A1 * | 10/2015 | Takeuchi .............. F04B 43/046 423/598 |

FOREIGN PATENT DOCUMENTS

| | | |
|---|---|---|
| JP | 09-223831 | 8/1997 |
| JP | 3377874 | 12/2002 |
| JP | 2006-096647 | 4/2006 |
| JP | 2006-176385 | 7/2006 |
| JP | 2006-278986 | 10/2006 |
| JP | 4171908 | 8/2008 |
| JP | 2009-117592 | 5/2009 |
| JP | 2009-293130 | 12/2009 |

OTHER PUBLICATIONS

C. Constantin et al., "Pyroelectric detectors from RF sputtered PZT type materials", Key Engineering Materials, vols. 132-137, pp. 1120-1122, 1997.

* cited by examiner

UNIFORMITY IN 6-INCH WAFER (GENERAL) 3-INCH 1 μM PZT

SEM CROSS-SECTIONAL IMAGE OF SOL-GEL PZT THICK FILM

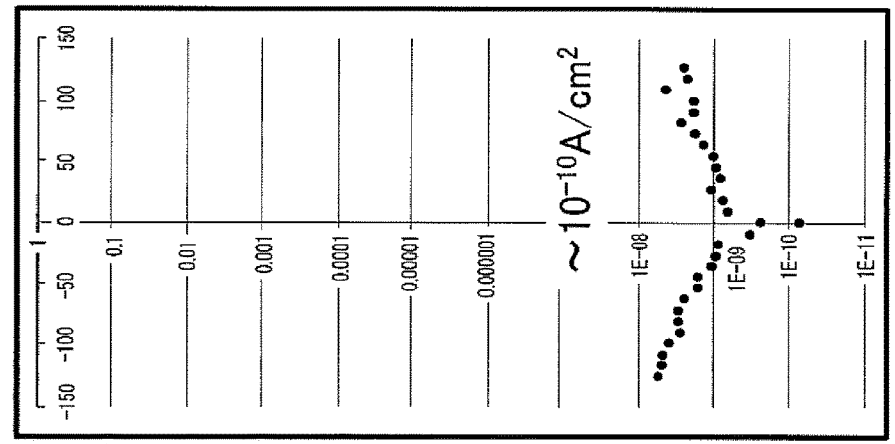
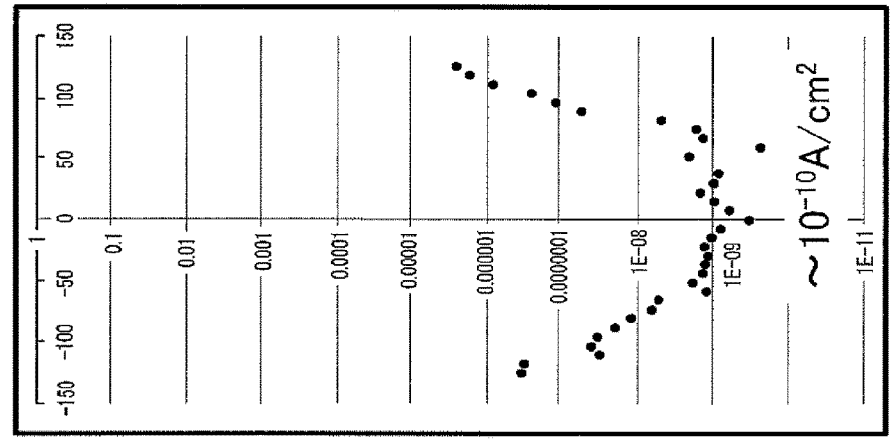
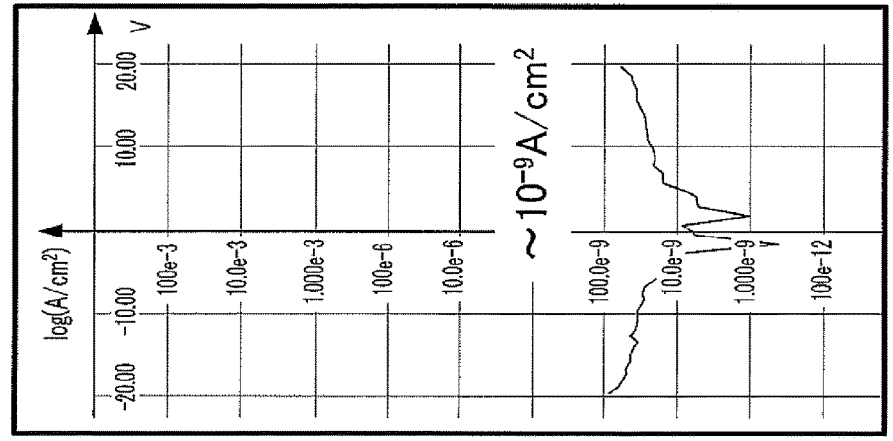

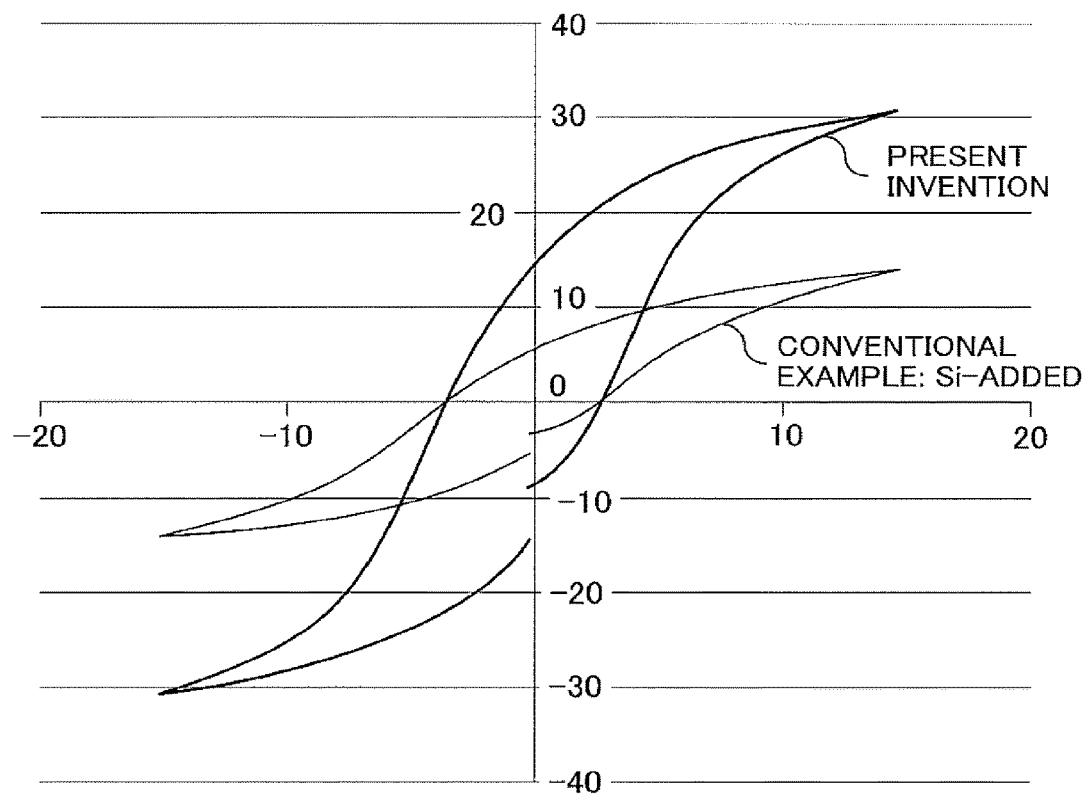

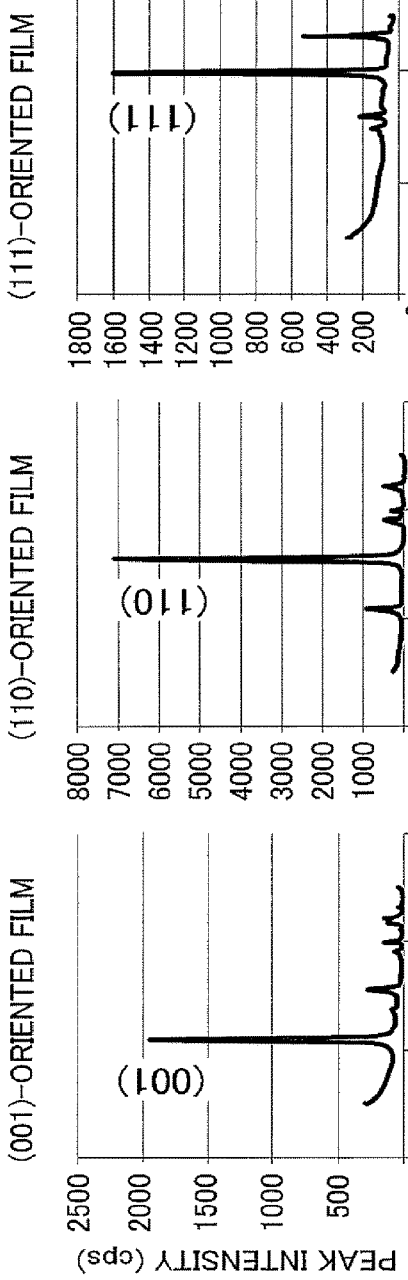
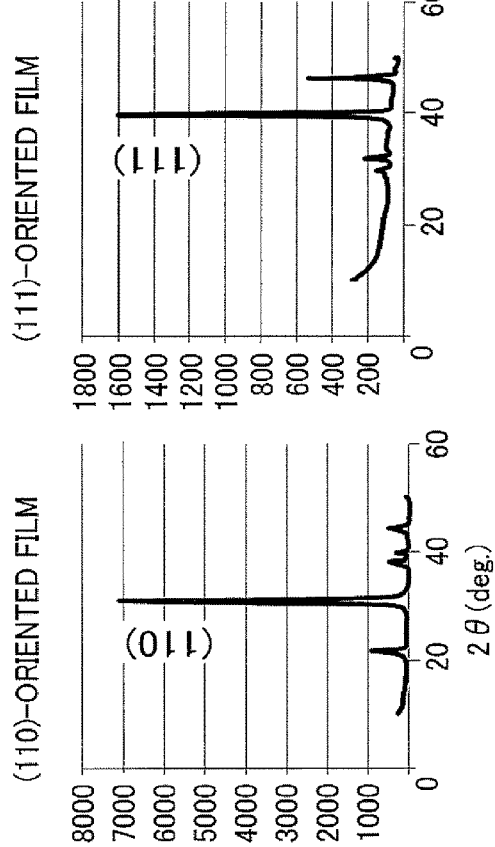
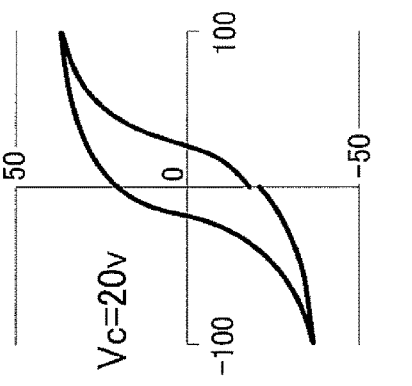
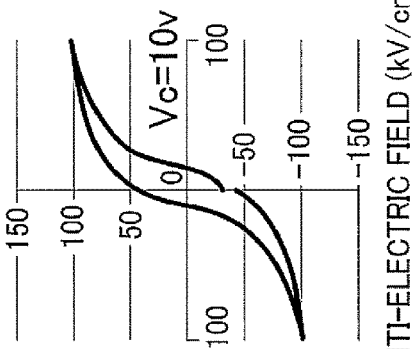
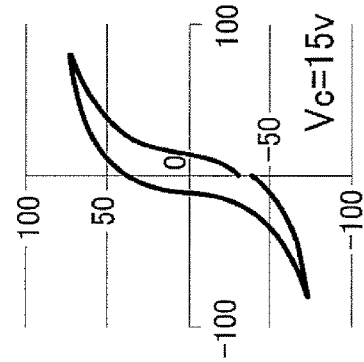
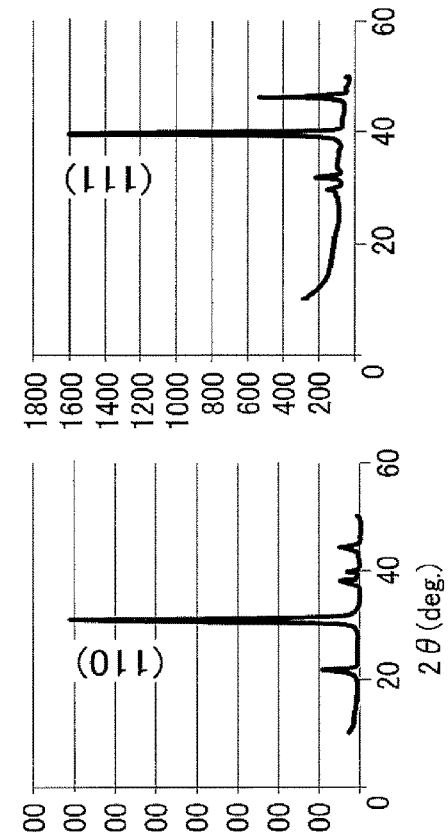
FIG. 11A (001)-ORIENTED FILM
FIG. 11B (110)-ORIENTED FILM
FIG. 11C (111)-ORIENTED FILM
FIG. 11D
FIG. 11E
FIG. 11F

PBNZT FERROELECTRIC FILM, SOL-GEL SOLUTION, FILM FORMING METHOD AND METHOD FOR PRODUCING FERROELECTRIC FILM

TECHNICAL FIELD

The present invention relates to a PBNZT ferroelectric film, a sol-gel solution, a film forming method using the sol-gel solution, a ferroelectric material film formed by the film forming method, and a method for producing a ferroelectric film.

BACKGROUND ART (1) A PZT Film by a Sol-Gel Method

A PZT film formed by a sol-gel method is conventionally known. However, the PZT film has following drawbacks.

Since Pb has a high vapor pressure, Pb comes out easily from the PZT film. As the result, according to the principle of electric charge neutrality, an oxygen ion deficiency is large, a leak current density is larger than $10^{-6}$ A/cm$^2$, and the film is a porous film containing large amount of air bubbles, and furthermore, in the case of a thick film of 1 μm or more used for MEMS, the film has black color and has lost interference color. Moreover, in a sol-gel method by spin coating, when a thick PZT film of 1 μm or more is to be fabricated, cracks appear easily due to a large residual stress of the thick PZT film. In addition, in a film forming method of a PZT film by a sol-gel method, the process time becomes long due to stacking of 20 layers or more.

(2) A PZT Film by a Sputtering Method (for Example, See Patent Document 1)

Patent Document 1 discloses a PZT film formed by a sputtering method. The PZT film has advantages such as a small leak current density, capability of epitaxial growth and high initial properties.

But, the PZT film has following drawbacks.

Since the PZT film is exposed to plasma during the film formation, it is damaged easily by ions etc., the PZT film is imprinted, or the hysteresis is deformed and properties are likely to be deteriorated. Since an epitaxial growth proceeds slowly, the film forming time is as long as several hours. Furthermore, since the manufacturing apparatus makes use of a high vacuum and high temperature, the cost becomes high and the product unit price cannot be lowered. Moreover, since the formation of uniform plasma in the film forming is difficult, the variation of film properties and film thickness of the PZT film becomes large to make mass productivity poor.

Especially when a sputtering method is employed for mass production, variation of the composition, thickness and various properties of PZT films are large due to the influence of erosion.

(3) A PZTN Film (for Example, See Patent Document 2)

Patent Document 2 discloses a ferroelectric film including a perovskite-structured ferroelectric substance represented by ABO$_3$, the disclosure being a PZTN ferroelectric film in which the perovskite-structured ferroelectric substance is a PZT-based ferroelectric substance containing Pb$^{2+}$ as A-site ions and containing Zr$^{4+}$ and Ti$^{4+}$ as B-site ions, and containing Si$^{2+}$ in the A-site as A-site compensation ions and containing Nb$^{5+}$ in the B-site as B-site compensation ions.

But, the PZTN ferroelectric film has following drawbacks.

Since it contains Si$^{2+}$ in the A-site as A-site compensation ions, the ferroelectricity is deteriorated largely by the Si (see FIG. 5). Although it contains Si$^{2+}$ in the A-site as A-site compensation ions and Nb$^{5+}$ in the B-site as B-site compensation ions, Si and Nb can not sufficiently prevent the deficiency of an oxygen ion, or not sufficiently suppress the leak current. Furthermore, when making a PZTN ferroelectric film thick, a thick film is obtained, by a sol-gel method, through the use of a sol-gel solution having a large contact angle (for example, 60° or more). Therefore, air bubbles enter easily into the PZTN ferroelectric film.

RELATED TECHNICAL DOCUMENTS

Patent Documents

Patent Document 1: Japanese Patent No. 3377874
Patent Document 2: Japanese Patent No. 4171908

DISCLOSURE OF THE INVENTION

Problems to be Solved by the Invention

As described above, the PZTN ferroelectric film contains Si$^{2+}$ in the A-site as the A-site compensation ions and Nb$^{5+}$ in the B-site as the B-site compensation ions, but Si and Nb cannot sufficiently prevent the deficiency of oxygen ions.

That is, the conventional method performs control by replacing the A-site ions in a lead (2+) deficiency position with Si$^{2+}$ and replacing the B-site ions (4+) with Nb$^{5+}$. However, according to repeated studies by the present inventors, it has been found that Si can not sufficiently attain a function of preventing oxygen ion deficiency to deteriorate the ferroelectricity (see FIG. 5). It is like putting the cart before the horse if Si lets ferroelectric substance properties deteriorate even if an effect of preventing oxygen ion deficiency is exhibited. IF the prevention of the oxygen ion deficiency without Si is tried, two Nb atoms are necessary instead of one Si atom, and there is a problem of increasing the crystallization temperature as described in Patent Document 2.

Furthermore, as described above, for the thickening of the conventional PZTN ferroelectric film, the thickness is made large through the use of a sol-gel solution having a large contact angle (for example, 60° or more) by a sol-gel method, and thus there is a problem in which air bubbles enter easily into the PZTN ferroelectric film.

An aspect of the present invention aims at providing a PBNZT ferroelectric film capable of preventing sufficiently the deficiency of an oxygen ion, a sol-gel solution, a film forming method using the sol-gel solution, a ferroelectric material film formed by the film forming method, and a method for producing a ferroelectric film.

Another aspect of the present invention aims at providing a sol-gel solution into which air bubbles hardly enter when it is formed into a thick film, a film forming method using the sol-gel solution, a ferroelectric material film formed by using the film forming method, and a method for producing a ferroelectric film.

Means for Solving the Problems

In a ferroelectric film according to an aspect of the present invention, Bi$^{3+}$ is added to a lead (2+) deficient position and, simultaneously, B-site ions (4+) are replaced with Nb$^{5+}$ ions, which makes it possible to prevent at once one oxygen ion deficiency (2−) by equivalent Bi+Nb=2+, differing from conventional technologies.

(1) to (38) below are to explain a plurality of aspect of the present invention.

(1) A PBNZT ferroelectric film that is a ferroelectric film including a perovskite-structured ferroelectric substance represented by $ABO_3$, and the perovskite-structured ferroelectric substance is a PZT-based ferroelectric substance containing $Pb^{2+}$ as A-site ions and containing $Zr^{4+}$ and $Ti^{4+}$ as B-site ions;

the A-site contains $Bi^{3+}$ as A-site compensation ions; and the B-site contains $Nb^{5+}$ as B-site compensation ions.

(2) A PBNZT ferroelectric film that is a ferroelectric film including a perovskite-structured ferroelectric substance represented by $ABO_3$ including an oxygen ion deficiency, and the perovskite-structured ferroelectric substance is a PZT-based ferroelectric substance containing $Pb^{2+}$ as A-site ions and containing $Zr^{4+}$ and $Ti^{4+}$ as B-site ions;

the A-site contains $Bi^{3+}$ as A-site compensation ions;

the B-site contains $Nb^{5+}$ as B-site compensation ions; and the total of a surplus valence number in the whole A-site by said A-site compensation ions and a surplus valence number in the whole B-site by said B-site compensation ions is the same as a deficient valence number corresponding to the amount of the oxygen ion deficiency or is smaller than the deficient valence number.

(3) A PBNZT ferroelectric film that is a ferroelectric film including a perovskite-structured ferroelectric substance represented by $(Pb_{1-X}Bi_X)((TiZr)_{1-Y}Nb_Y)O_3$, wherein:

X is 1 to 10 mol %; and

Y is 1 to 10 mol %.

Meanwhile, preferably, an A-site contains $Bi^{3+}$ as A-site compensation ions and a B-site contains $Nb^{5+}$ as B-site compensation ions.

(4) A PBNZT ferroelectric film that is a ferroelectric film including a perovskite-structured ferroelectric substance represented by $(Pb_{1-X}Bi_X)((TiZr)_{1-Y}Nb_Y)O_3$, and X is 1 to 10 mol %; and Y is 1 to 10 mol % and X=Y.

Meanwhile, preferably, an A-site contains $Bi^{3+}$ as A-site compensation ions and a B-site contains $Nb^{5+}$ as B-site compensation ions.

(5) The PBNZT ferroelectric film according to the above (2), and the amount of oxygen ion deficiency is 20 mol % or less relative to the stoichiometric composition of the perovskite-structured ferroelectric substance.

(6) The PBNZT ferroelectric film according to any one of the above (1), (2) and (5), and the content of the A-site compensation ions is 10 mol % or less relative to the stoichiometric composition of the perovskite-structured ferroelectric substance; and the content of the B-site compensation ions is 10 mol % or less relative to the stoichiometric composition of the perovskite-structured ferroelectric substance.

(7) The PBNZT ferroelectric film, in which the ferroelectric film according to any one of the above (1) to (6) has a pillar shape crystal structure.

(8) The PBNZT ferroelectric film, in which the ferroelectric film according to any one of the above (1) to (7) has scarcely air bubbles.

(9) The PBNZT ferroelectric film, in which the ferroelectric film according to any one of the above (1) to (8) has a micro Vickers hardness 600 to 1200 Hv (preferably 800 to 1000 Hv).

(10) A sol-gel solution for forming a ferroelectric film on a substrate, in which the sol-gel solution has a contact angle of 1 to not more than 40° with respect to the substrate.

(11) The sol-gel solution according to the above (10), in which the contact angle with respect to the substrate is 1 to not more than 20°.

(12) The sol-gel solution according to the above (10) or (11), in which the sol-gel solution includes a raw material solution including hydrolysis polycondensation of an alkoxide raw material including Pb, Bi, Nb, Zr and Ti.

(13) The sol-gel solution according to the above (12), in which the sol-gel solution includes a polycarboxylic acid or a polycarboxylic acid ester in the solvent.

(14) The sol-gel solution according to the above (13), in which the polycarboxylic acid ester includes heteropolyacid ions.

(15) The sol-gel solution according to the above (14), in which the heteropolyacid ion has a Keggin type structure represented by following Formula: $[XM_yM'_{12-y}O_{40}]^{n-}$ (where X is a hetero atom, M is a polyatom, M' is a polyatom different from M, n is a valence number, and y=1 to 11).

(16) The sol-gel solution according to the above (14), in which the heteropolyacid ion has a Keggin type structure represented by Formula: $[XM_{11}O_{39}]^{n-}$ (where X is a hetero atom, M is a polyatom, and n is a valence number).

(17) The sol-gel solution according to the above (14), in which the heteropolyacid ion has a Keggin type structure represented by following Formula: $[XM_zM'_{11-z}O_{39}]^{n-}$ (where X is a hetero atom, M is a polyatom, M' is a polyatom different from M, n is a valence number, and z=1 to 10).

(18) The sol-gel solution according to any one of the above (14) to (17), in which the sol-gel solution includes, among the heteropolyacid ions, heteropolyacid ions according to any one of claims 7 to 10 in that the hetero atom includes the group consisting of B, Si, P, S, Ge, As, Mn, Fe and Co and the polyatom includes the group consisting of Mo, V, W, Ti, Al, Nb and Ta, as a part of a precursor structure of a ferroelectric ceramics.

(19) The sol-gel solution according to any one of the above (12) to (18), in which the sol-gel solution includes at least one of a high viscosity polyhydric alcohol, glycol ethers, a lower alcohol and a basic alcohol in the solvent.

(20) The sol-gel solution according to any one of the above (12) to (19), in which:

the ferroelectric film includes a perovskite-structured ferroelectric substance represented by $(Pb_{1-X}Bi_X)((TiZr)_{1-Y}Nb_Y)O_3$;

X is 1 to 10 mol %;

Y is 1 to 10 mol %; and the surplus lead addition amount included in the raw material solution is 15 mol % or more.

(21) The sol-gel solution according to any one of the above (10) to (20), wherein the sol-gel solution includes polar solvents.

(22) The sol-gel solution according to the above (21), in which the polar solvent or the like is any one of methyl ethyl ketone, 1,4-dioxane, 1,2-dimethoxyethane acetamide, N-methyl-2-pyrrolidone, acetonitrile, dichloromethane, nitromethane, trichloromethane, dimethylformamide and monomethylformamide or a plurality of combinations thereof.

(23) The sol-gel solution according to any one of the above (10) to (22), in which the sol-gel solution includes an unsaturated fatty acid.

(24) The sol-gel solution according to the above (23), in which:

the unsaturated fatty acid is any one of monounsaturated fatty acid, diunsaturated fatty acid, triunsaturated fatty acid, tetraunsaturated fatty acid, pentaunsaturated fatty acid and hexaunsaturated fatty acid or a plurality of combinations thereof;

the monounsaturated fatty acid is any one of crotonic acid, myristoleic acid, palmitoleic acid, oleic acid, elaidic acid, vaccenic acid, gadoleic acid, eicosenoic acid, erucic acid and nervonic acid or a plurality of combinations thereof;

the diunsaturated fatty acid is any one of linoleic acid, eicosadienoic acid and docosadienoic acid or a plurality of combinations thereof;

the triunsaturated fatty acid is any one of linolenic acid, pinolenic acid, eleostearic acid, mead acid, dihomo-γ-linolenic acid and eicosatrienoic acid or a plurality of combinations thereof;

the tetraunsaturated fatty acid is any one of stearidonic acid, arachidonic acid, eicosatetraenoic acid and adrenic acid or a plurality of combinations thereof;

the pentaunsaturated fatty acid is any one of bosseopentaenoic acid, eicosapentaenoic acid, osbond acid, clupanodonic acid and tetracosapentaenoic acid or a plurality of combinations thereof; and the hexaunsaturated fatty acid is any one of docosahexaenoic acid and nisinic acid or a plurality of combinations thereof.

(25) A method for producing a ferroelectric film, in which the sol-gel solution according to any one of the above (10) to (24) is used for production of the PBNZT ferroelectric film according to any one of the above (1) to (9).

(26) A method for producing a ferroelectric film, in which the sol-gel solution according to any one of the above (10) to (24) is used for production of a ferroelectric film having a relative permittivity of 400 or more (more preferably relative permittivity of 600 or more).

(27) A ferroelectric film being formed by the method for producing a ferroelectric film according to the above (26) and having a relative permittivity of 400 or more (more preferably a relative permittivity of 600 or more).

(28) A film forming method, including the steps of:

coating the sol-gel solution according to any one of the above (10) to (24) on a substrate to form a coated film on the substrate;

temporarily burning the coated film;

repeating the formation of the coated film and the temporary burning a plurality of times to form a ferroelectric material film including the plural number of coated films on the substrate.

(29) The film forming method according to the above (28), in which:

the ferroelectric material film has a thickness of more than 300 nm; and the ferroelectric material film is subjected to a heat treatment to crystallize collectively the ferroelectric material film.

(30) A method for producing a ferroelectric film, including the steps of:

forming a ferroelectric material film on a substrate by using the film forming method according to the above (28) or (29); and heat-treating the ferroelectric material film to form a ferroelectric film including a perovskite-structured ferroelectric substance obtained by crystallizing the ferroelectric material film, in which the ferroelectric film is the PBNZT ferroelectric film according to any one of claims 1 to 9.

(31) A method for producing a ferroelectric film including the steps of:

forming a ferroelectric material film on a substrate by using the film forming method according to (28) or (29); and heat-treating the ferroelectric material film to form, on the substrate, a ferroelectric film having a relative permittivity of 400 or more (more preferably a relative permittivity of 600 or more) obtained by crystallizing the ferroelectric material film.

(32) A ferroelectric film being formed by the method for producing the ferroelectric film according to the above (31) and having a relative permittivity of 400 or more (more preferably a relative permittivity of 600 or more).

(33) A method for producing a ferroelectric film including the steps of:

preparing a sol-gel solution including a raw material solution including: a hydrolysis polycondensation of an alkoxide raw material including Pb, Bi, Nb, Zr and Ti and heteropolyacid; and polar solvents and unsaturated fatty acids;

coating the sol-gel solution on a substrate to form a coated film on the substrate;

subjecting the coated film to temporary burning at a temperature of 25 to 450° C. to form a ferroelectric material film on the substrate; and heat-treating the ferroelectric material film at a temperature of 450 to 800° C. to produce a ferroelectric film including a perovskite-structured ferroelectric substance obtained by crystallizing the ferroelectric material film.

(34) The method for producing a ferroelectric film according to the above (29), wherein, when a ferroelectric material film is formed on the substrate, the formation of the coated film and the temporary burning are repeated a plurality of times to form a ferroelectric material film including the plurality of coated films on the substrate.

(35) The method for producing a ferroelectric film according to the above (33) or (34), wherein the ferroelectric film is the PBNZT ferroelectric film according to any one of claims 1 to 9.

(36) The method for producing a ferroelectric film according to the above (33) or (34), in which the ferroelectric film has a relative permittivity of 400 or more (more preferably a relative permittivity of 600 or more).

(37) A ferroelectric film being formed by the method for producing a ferroelectric film according to the above (36) and having a relative permittivity of 400 or more (more preferably a relative permittivity of 600 or more).

(38) The method for producing a ferroelectric film according to any one of the above (30), (31) and (33) to (36), in which the surface of the substrate has a (111)-oriented Pt or Ir film.

Advantage of the Invention

According to an aspect of the present invention, it is possible to provide a PBNZT ferroelectric film capable of preventing sufficiently the deficiency of an oxygen ion, a sol-gel solution, a film forming method using the sol-gel solution, a ferroelectric material film formed by the film forming method, or a method for producing a ferroelectric film.

Furthermore, according to another aspect of the present invention, it is possible to provide a sol-gel solution into which air bubbles hardly enter even if a film is made thick, a film forming method using the sol-gel solution, a ferroelectric material film formed by the film forming method, or a method for producing a ferroelectric film.

BRIEF DESCRIPTION OF THE DRAWINGS

FIGS. 4A to 4C are drawings showing the result of measuring a leak current density for each of ferroelectric films of samples 1 to 3.

FIG. 5 is a drawing showing the result of performing hysteresis evaluation of the PBNZT ferroelectric film in the Example of the present invention and a conventional PZT to which Si is added.

FIGS. 11A to 11C are drawings showing results of evaluating the crystallinity of the PBNZT thick film in the Example by XRD diffraction, FIG. 11D is a drawing showing a result of performing the hysteresis evaluation of the PBNZT thick film in FIG. 11A, FIG. 11E is a drawing showing a result of performing the hysteresis evaluation of the PBNZT thick film in FIG. 11B, and FIG. 11F is a drawing showing a result of performing the hysteresis evaluation of the PBNZT thick film in FIG. 11C.

BEST MODE FOR CARRYING OUT THE INVENTION

Figure 1:
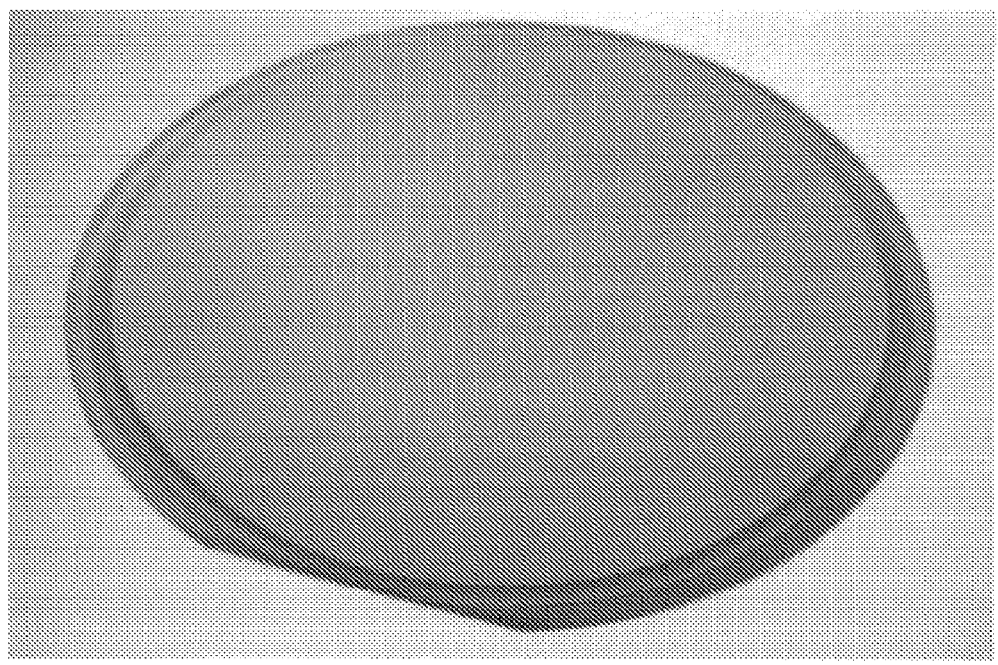
FIG. 1 is a photograph showing the ferroelectric film that is a sample 1 in Example.

Hereinafter, embodiments of the present invention will be explained in detail by using the drawings. But, a person skilled in the art can understand easily that the present invention is not limited to the explanation below, but that forms and details thereof can be changed variously without deviating from the purport and the scope of the present invention. Accordingly, the present invention should not be construed with the limitation to the content of the description of embodiments shown below.

The PBNZT ferroelectric film according to the embodiment includes a perovskite-structured ferroelectric substance represented by $ABO_3$. The perovskite-structured ferroelectric substance is a PZT-based ferroelectric substance containing $Pb^{2+}$ as A-site ions and containing $Zr^{4+}$ and $Ti^{4+}$ as B-site ions, and containing $Bi^{3+}$ at the A-site as A-site compensation ions, and containing $Nb^{5+}$ at the B-site as B-site compensation ions.

In detail, the ferroelectric film includes a perovskite-structured ferroelectric substance represented by $ABO_3$ including an oxygen ion deficiency, the perovskite-structured ferroelectric substance is a PZT-based ferroelectric substance containing $Pb^{2+}$ as A-site ions and containing $Zr^{4+}$ and $Ti^{4+}$ as B-site ions, the A-site contains $Bi^{3+}$ as A-site compensation ions and the B-site contains $Nb^{5+}$ as B-site compensation ions, and the total of a surplus valence number in the whole A-site due to the A-site compensation ions and a surplus valence number in the whole B-site due to the B-site compensation ions is equal to a deficient valence number corresponding to the amount of the oxygen ion deficiency, or smaller than the deficient valence number.

The amount of the oxygen ion deficiency is preferably 20 mol % or less relative to the stoichiometric composition of the perovskite-structured ferroelectric substance. Furthermore, the content of the A-site compensation ions is preferably 10 mol % or less relative to the stoichiometric composition of the perovskite-structured ferroelectric substance. Moreover, the content of the B-site compensation ions is preferably 10 mol % or less relative to the stoichiometric composition of the perovskite-structured ferroelectric substance.

Specifically, the ferroelectric film includes a perovskite-structured ferroelectric substance represented by $(Pb_{1-X}Bi_X)((TiZr)_{1-Y}Nb_Y)O_3$.

X is preferably 1 to 10 mol %, and Y is preferably 1 to 10 mol %.

According to the embodiment, since Bi has a stable valence number +3, it has a valence number greater than the A-site ion by +1, and since Nb has a stable valence number +5, it has a valence number greater than the B-site ion by +1. Therefore, the surplus valence number becomes +2, thereby being able to prevent reliably the deficiency of an oxygen (−2 valence) ion. That is, by replacing the A-site ion with the added Bi ion and replacing the B-site ion with the added Nb ion, it is possible to prevent the deficiency of an oxygen ion, to bring the state close to complete oxidation, and to bring the charge neutrality in the perovskite structure in to existence. For example, when a perovskite-structured ferroelectric substance represented by $ABO_3$ is a PZT-based ferroelectric substance, a ferroelectric film is formed so that the total of the surplus valence number +1 valence ((Bi: +3 valence)−(Pb: +2 valence)=(+1 valence)) caused by the addition of the A-site compensation ions and the surplus valence number +1 valence caused by the addition of the B-site compensation ions ((Nb: +5 valence)−(Ti: +4 valence)=(+1 valence)), that is, Bi addition amount×(+1 valence)+Nb addition amount×(+1 valence) becomes not more than the deficient valence number corresponding to the oxygen ion deficiency amount (oxygen ion deficiency amount×(−2 valence)).

Next, the method for producing a ferroelectric film according to the embodiment will be explained in detail. The ferroelectric film includes a perovskite-structured ferroelectric substance represented by $(Pb_{1-X}Bi_X)((TiZr)_{1-Y}Nb_Y)O_3$, where X is 1 to 10 mol % and Y is 1 to 10 mol %.

[1] Substrate

On a substrate such as a 6-inch Si wafer, a foundation film oriented in a prescribed crystal plane is formed. As the foundation film, for example, a (111)-oriented Pt film or Ir film is used.

[2] Sol-Gel Solution

A sol-gel solution having a contact angle of 40° or less, preferably 20° or less with the substrate is prepared.

The sol-gel solution is fabricated as follows.

(1) Fabrication of a Ceramic Precursor (PZT Condensation Polymer)

In detail, anhydrous lead acetate $Pb(CH_3COO)_2$, zirconium isopropoxide $Zr(O-i-C_3H_7)_4$, and titanium isopropoxide $Ti(O-i-C_3H_7)_4$ are employed as starting materials, and a gel obtained by a reaction of lead acetate and metal alkoxide by distillation and reflux in 2-methoxyethanol and an alcohol exchange reaction is set to be a precursor raw material for forming PZT ceramics.

(2-1) Element Addition 1

To the precursor raw material for forming PZT ceramics, the octylate that is any one of Nb octylate and Bi octylate, or the octylates that are both Nb octylate and Bi octylate are added. Preferably, when any one is to be added, it is added in 10 mol % or less, and, when both are to be added, each is added in 5 mol % or less. Furthermore, preferably, one or more of octylates of Mo, V, W, Al, Ta, B, Si, P, S, Ge, As, Fe, Mn, Co are added in 3 mol % or less, respectively.

(2-2) Element Addition 2

A divalent carboxylic acid or a divalent carboxylic acid ester is added to the solvent in an amount not less than the equivalent volume relative to the added element. As the divalent carboxylic acid, the use of succinic acid, oxalic acid, malonic acid, adipic acid, maleic acid, fumaric acid or the like is preferable, and, as the divalent carboxylic acid ester, the use of at least one kind selected from succinic acid esters, malonic acid esters and maleic acid esters is preferable. Specific examples of these esters include dimethyl succinate, dimethyl maleate, and dimethyl malonate. These divalent carboxylic acid esters dissociate in the presence of alcohol to show the action as divalent carboxylic acid.

The divalent carboxylic acid ester preferably contains a heteropolyacid ion containing, for example, $Mn^{2+}$ as a hetero ion.

The sol-gel solution contains, as a part of the precursor structure of the ferroelectric substance ceramics, a heteropolyacid ion having a Keggin type structure with a non-centrosymmetric molecular structure to express nonlinearity as a constituent component wherein at least one of the polyatom of the heteropolyacid ion is deficient or a part of the polyatom of the heteropolyacid ion is replaced with another atom.

The heteropolyacid ion is one having a Keggin type structure represented by following Formula $[XM_yM'_{12-y}O_{40}]^{n-}$ (where X is a hetero atom, M is a polyatom, M' is a polyatom different from M, n is a valence number, and y=1 to 11), and the heteropolyacid ion is contained as a part of the precursor structure of the ferroelectric substance ceramics.

Furthermore, the heteropolyacid ion may be one having a Keggin type structure represented by Formula: $[XM_{11}O_{39}]^{n-}$ (where X is a hetero atom, M is a polyatom, and n is a valence number), and the heteropolyacid ion is contained as a part of the precursor structure of the ferroelectric substance ceramics.

Moreover, the heteropolyacid ion is one having a Keggin type structure represented by following Formula: $[XM_zM'_{11-z}O_{39}]^{n-}$ (where X is a hetero atom, M is a polyatom, M' is a polyatom different from M, n is a valence number, and z=1 to 10), and the heteropolyacid ion is contained as a part of the precursor structure of the ferroelectric substance ceramics.

It is also possible that, in the heteropolyacid ion, the hetero atom includes the group consisting of B, Si, P, S, Ge, As, Mn, Fe and Co and the polyatom includes the group consisting of Mo, V, W, Ti, Al, Nb and Ta, and the heteropolyacid ion may be contained as a part of the precursor structure of the ferroelectric substance ceramics.

The sol-gel solution preferably contains polar solvents. The polar solvent or the like is any one of methyl ethyl ketone, 1,4-dioxane, 1,2-dimethoxyethane acetamide, N-methyl-2-pyrrolidone, acetonitrile, dichloromethane, nitromethane, trichloromethane, dimethylformamide and monomethylformamide, or a plurality of combinations thereof.

(3) Film Thickening (High Viscosity Polyhydric Alcohol)

To a precursor raw material for forming PZT ceramics, a high viscosity polyhydric alcohol is added. Consequently, it becomes possible to make the film thick when the sol-gel solution is coated. Meanwhile, as the high viscosity polyhydric alcohol, preferably either of ethylene glycol or diethylene glycol, or both of these are added in a volume of ½ or less of the whole.

(4) Deaeration (Unsaturated Fatty Acid)

The sol-gel solution contains preferably unsaturated fatty acid in not more than ⅓ of the whole volume. Consequently, the inside of the coated film obtained by coating the sol-gel solution can be deaired.

The unsaturated fatty acid is any one of monounsaturated fatty acid, diunsaturated fatty acid, triunsaturated fatty acid, tetraunsaturated fatty acid, pentaunsaturated fatty acid and hexaunsaturated fatty acid, or a plurality of combinations thereof.

Examples of the monounsaturated fatty acids include crotonic acid, myristoleic acid, palmitoleic acid, oleic acid, elaidic acid, vaccenic acid, gadoleic acid, eicosenoic acid, erucic acid and nervonic acid, and any, or a plurality of combinations thereof may be used.

Examples of the diunsaturated fatty acids include linoleic acid, eicosadienoic acid and docosadienoic acid, and any, or a plurality of combinations thereof may be used.

Examples of the triunsaturated fatty acids include linolenic acid, pinolenic acid, eleostearic acid, mead acid, dihomo-γ-linolenic acid and eicosatrienoic acid, and any, or a plurality of combinations thereof may be used.

Examples of the tetraunsaturated fatty acids include stearidonic acid, arachidonic acid, eicosatetraenoic acid and adrenic acid, and any, or a plurality of combinations thereof may be used.

Examples of the pentaunsaturated fatty acids include bosseopentaenoic acid, eicosapentaenoic acid, osbond acid, clupanodonic acid and tetracosapentaenoic acid, and any, or a plurality of combinations thereof may be used.

Examples of the hexaunsaturated fatty acids include docosahexaenoic acid and nisinic acid, and either, or a plurality of combinations thereof may be used.

(5) A Solvent for a Hardly Soluble Component (Glycol Ether)

To the sol-gel solution, glycol ether is preferably added as a solvent for a hardly soluble component. Consequently, it becomes possible to dissolve a hardly soluble component in the sol-gel solution. The glycol ether includes ethylene glycol-based ethers and propylene glycol-based ethers based on respective groups of aliphatic series such as methyl, n-propyl, i-propyl, n-butyl, i-butyl, hexyl and 2-ethylhexyl, allyl and phenyl having a double bond, and benzyl. They are liquids having no color and a little smell, and provided with properties of both alcohols and ethers because they have an ether group and a hydroxyl group in the molecule. That is, the liquid functions as a solvent for a hardly soluble component, and, in addition, functions as alcohol, which is a function of improving the wettability with the substrate. Among these, dialkyl glycol ether is obtained by replacing a hydrogen at the end of ethylene glycol, diethylene glycol or triethylene glycol with an alkyl group, and has two or more ether groups in the molecule and is used as a solvent for taking the solubility very seriously. An ester with acetic acid is employed for the purpose of improving the solubility, and esters with acrylic acid or methacrylic acid are employed for the purpose as a viscosity modifier.

It is preferable to use any one, or a plurality of combinations of the above-mentioned glycol ethers. Furthermore, glycol ether is preferably added until the dissolution of the unsaturated fatty acid.

(6) Stable Coating on a Pt/Si Substrate (Lower Alcohol)

Lower alcohol is preferably added to the sol-gel solution. Consequently, it becomes possible to stably coat the sol-gel solution on the Pt/Si substrate. As the lower alcohol, particularly, alcohols having four carbons or less are preferable, and any one of, or a plurality of combinations of methanol, ethanol, 1-propanol, 2-propanol, 1-butanol, 2-methyl-1-propanol, 2-butanol and 2-methyl-2-propanol is preferable. The alcohol has a good compatibility with a Pt electrode. It is preferable to adjust the addition amount of the lower alcohol so that, when the sol-gel solution is coated on the substrate, the contact angle of the coated film with the substrate is 1 to 40° (preferably 1 to 20°). If the addition amount of the lower alcohol is increased too much, the thickness of the coated film per one layer becomes too thin, and, therefore, the addition amount is desirably three times or less the whole volume.

(7) Stabilization of the Solution (Basic Alcohol)

To the sol-gel solution, basic alcohol for stabilizing the solution is preferably added. Consequently, it becomes possible to stabilize the sol-gel solution.

In detail, it is preferable to add one or more of 2-aminoethanol, 2-(2-aminoacylamino) ethanol, 2-(2-aminoethoxy) ethanol, 5-amino-2,3-dihydrophthalazine-1,4-dione, 2-amino-3-phenyl-1-propanol, 2-amino-1-butanol and 4-amino-1-butanol among aminoalcohols that are basic alcohols to the sol-gel solution to adjust so that pH is 5 to 7.

[3] Coating of the Sol-Gel Solution on a Substrate

On a substrate having a (111)-oriented Pt film formed on the surface of 6-inch Si wafer, the sol-gel solution was coated, and the contact angle of the sol-gel solution with the substrate was measured to give the result of 20° or less. Meanwhile, the contact angle with the substrate can be 1 to 40° (preferably 1 to 20°).

The sol-gel solution is coated onto a substrate by a spin-coating method to form a coated film on the substrate, the coated film is subjected to temporary burning at a temperature of 25 to 450° C. (preferably a temperature of 450° C.), and, by repeating the formation of the coated film and the temporary burning a plurality of times, a ferroelectric material film including a plurality of coated films is formed on the substrate. Meanwhile, in the embodiment, the sol-gel solution is coated by a spin-coating method, but, it is not limited to the spin-coating method and the coating by other coating methods is also possible, including, for example, a doctor blade method, a screen printing method, a dip-coating method, a spray-coating method, an evaporation method, an atmospheric pressure plasma CVD method or the like.

[4] A Crystallization Method

A heat treatment of a ferroelectric material film at a temperature of 450 to 800° C. (preferably a temperature of 700° C.) makes it possible to crystallize the ferroelectric material film. The condition of the heat treatment at this time is to perform burning in a pressurized oxygen atmosphere of 2 to 9.9 atm, at a temperature increase rate of 100 to 150° C./sec for 1 to 5 minutes. In addition, the thickness of a ferroelectric material film when crystallizing collectively the ferroelectric material film is preferably a thickness exceeding 300 nm.

The ferroelectric film thus fabricated contains scarcely air bubbles even when it is a thick film having a thickness of 500 or more. In other words, by forming the film in this manner, a good and thick film can be formed. The reason is because the film has a structure in which organic components have disappeared almost in the thickness direction, and the film scarcely shrinks in the substrate plane, the shrinkage being at the level of being cancelled by the expansion due to oxidation. Accordingly, the substrate has scarcely warpage.

It should be noted that the repetition of the formation and crystallization of the ferroelectric material film also makes it possible to form a ferroelectric film having a thickness of 2 μm or more.

Moreover, in the embodiment, the method for producing the ferroelectric film, which includes the perovskite-structured ferroelectric substance represented by $(Pb_{1-X}Bi_X)((TiZr)_{1-Y}Nb_Y)O_3$ where X is 1 to 10 mol % and Y is 1 to 10 mol %, is explained. And, the use of the sol-gel solution or the film forming method according to the embodiment makes it possible to produce ferroelectric films other than the above-mentioned ferroelectric film having a relative permittivity of 400 or more (more preferably a relative permittivity of 600 or more).

EXAMPLES

Example 1

On a 6-inch Si wafer, via a silicon oxide film, a Ti film of 10 to 30 nm is formed by a sputtering method. In detail, the film was formed by an RF sputtering method. The Ti film functions as adhesion layer of platinum and silicon oxide. The Ti film was formed under the film-forming conditions of argon gas pressure 0.2 Pa and power source output 0.12 kW for 20 minutes. The film formation was performed at the substrate temperature of 200° C.

Next, the Ti film is subjected to a heat treatment by RTA (Rapid Thermal Anneal) at the temperature of 650° C. for 5 minutes. The heat treatment was performed in an oxygen atmosphere at 9.9 atm and 100° C./s.

Then, on the Ti film, a 100 nm first Pt film is formed by a sputtering method at the temperature of 550 to 650° C. The film was formed at argon gas pressure 0.4 Pa, source output DC 100 W and film-forming time 25 minutes.

After that, on the first Pt film, a 100 nm second Pt film is formed by an evaporation method at ordinary temperatures. The film was formed at $3.3 \times 10^{-3}$ Torr, source output 10 kV and film-forming time 4 minutes.

Next, the Si wafer is subjected to a heat treatment by RTA at the temperature of 650 to 750° C. for 1 to 5 minutes. In this way, a 6-inch Si wafer having a (111)-oriented Pt film formed on the surface is prepared.

Then, a sol-gel solution having a contact angle of 40° or less, preferably 20° or less with the 6-inch Si wafer is prepared. In detail, the sol-gel solution contains a raw material solution containing a heteropolyacid containing Pb, Bi, Nb, Zr and Ti, polar solvents, and unsaturated fatty acids.

The raw material solution for forming a PBNZT ferroelectric film is composed of a mixture with a heteropolyacid being a polyacid of a $(X_lM_mO_n)^{x-}$ type in which a hetero atom is inserted into a metal oxygen acid skeleton. The polyatom includes M=Mo, V, W, Ti, Al, Nb and Ta, the hetero atom means elements other than H and C, and a sol-gel solution for forming an oxide film preferably including M=B, Si, P, S, Ge, As, Fe, Co and Bi.

The polar solvent or the like is any one of methyl ethyl ketone, 1,4-dioxane, 1,2-dimethoxyethane acetamide, N-methyl-2-pyrrolidone, acetonitrile, dichloromethane, nitromethane, trichloromethane, dimethylformamide and monomethylformamide, or a plurality of combinations thereof.

As to the unsaturated fatty acids, examples of the monounsaturated fatty acids include crotonic acid, myristoleic acid, palmitoleic acid, oleic acid, elaidic acid, vaccenic acid, gadoleic acid, eicosenoic acid, erucic acid and nervonic acid, examples of the diunsaturated fatty acids include linoleic acid, eicosadienoic acid and docosadienoic acid, examples of the triunsaturated fatty acids include linolenic acid, pinolenic acid, eleostearic acid, mead acid, dihomo-γ-linolenic acid and eicosatrienoic acid, examples of the tetraunsaturated fatty acids include stearidonic acid, arachidonic acid, eicosatetraenoic acid and adrenic acid, examples of the pentaunsaturated fatty acids include bosseopentaenoic acid, eicosapentaenoic acid, osbond acid, clupanodonic acid and tetracosapentaenoic acid, and examples of the hexaunsaturated fatty acids include docosahexaenoic acid and nisinic acid.

Next, by coating, by a spin-coating method, the sol-gel solution on the 6-inch Si wafer covered with the Pt electrode, a first layer coated film is formed on the Si wafer. In detail, the sol-gel solution 500 μL was coated, the rotation speed of the coated wafer is increased from 0 to 500 rpm in 3 seconds, the rotation speed of 500 rpm was held for 3 seconds, then the coated wafer was rotated at 2500 rpm for 60 seconds, and the rotation was stopped.

Next, the first layer coated film is heated at a temperature of 175° C. for 1 minute by a hot plate, and after that, is subjected to temporary burning at the temperature of 450° C. for 5 minutes. Consequently, on the Si wafer, a first layer ferroelectric substance material amorphous film having thickness 100 nm is formed.

Subsequently, in the same way as that in the first layer coated film, a second layer coated film is formed on the first ferroelectric material film. Subsequently, in the same way as that in the first layer coated film, the second layer coated film is heated to be subjected to temporary burning. Consequently, on the first layer ferroelectric material film, the second layer ferroelectric material film having thickness of 100 nm is formed.

Then, in the same way as that in the second layer coated film, a third layer coated film is formed on the second layer ferroelectric material film. Next, in the same way as that in the first layer coated film, the third layer coated film is heated to be subjected to temporary burning. Consequently, on the second layer ferroelectric material film, the third layer ferroelectric material film having a thickness of 100 nm is formed.

Subsequently, in the same way as that in the first layer coated film, a fourth layer coated film is formed on the third layer ferroelectric material film. Next, in the same way as that in the first layer coated film, the fourth layer coated film is heated to be subjected to temporary burning. Consequently, on the third layer ferroelectric material film, the fourth layer ferroelectric material film having a thickness of 100 nm is formed.

Subsequently, in the same way as that in the first layer coated film, a fifth layer coated film is formed on the fourth layer ferroelectric material film. Next, in the same way as that in the first layer coated film, the fifth layer coated film is heated to be subjected to temporary burning. Consequently, on the fourth layer ferroelectric material film, the fifth layer ferroelectric material film having a thickness of 100 nm is formed. In this way, the ferroelectric material film having a thickness of 500 nm, including five layers can be formed.

Next, a heat treatment of the ferroelectric material film by pressurized RTA crystallizes the ferroelectric material film to form the ferroelectric film. At this time, the heat treatment condition was a temperature increase rate 120° C./sec in a pressurized oxygen atmosphere having an oxygen partial pressure of 9.9 atm, which instantaneously increased the temperature up to 700° C. and held the temperature of 700° C. for 1 minute, thereby crystallizing the ferroelectric material film.

Next, on the ferroelectric material film, in the same way as above, by the repetition of formation, heating and temporary burning of the coated film, a ferroelectric material film having a thickness of 500 nm, including five layers is further formed. By crystallizing the ferroelectric material film in the same way as above, a ferroelectric film is formed, and the formation and crystallization of the ferroelectric material film is further repeated twice in the same way as above. Consequently, a sample 1, in which a ferroelectric film including a thick film having 2 μm is formed on the Si wafer, can be obtained.

Next, samples 2 and 3 having a ferroelectric film formed on a Si wafer are fabricated. Each of the samples 2 and 3 is fabricated in the same way as in sample 1, except that heat treatment conditions when crystallizing the ferroelectric material film are different from those in sample 1.

The heat treatment condition of the sample 2 was a temperature increase rate 120° C./sec in a pressurized oxygen atmosphere having an oxygen partial pressure of 5 atm, which instantaneously increased the temperature of the sample 2 up to 700° C. and held the temperature of 700° C. for 1 minute, thereby crystallizing the sample 2.

The heat treatment condition of the sample 3 was a temperature increase rate 120° C./sec in a pressurized oxygen atmosphere having an oxygen partial pressure of 7.5 atm, which instantaneously increased the temperature of the sample 3 up to 700° C. and held the temperature of 700° C. for 1 minute, thereby crystallizing the sample 3.

FIG. 1 is a photograph showing the ferroelectric film of the sample 1.

Figure 2:
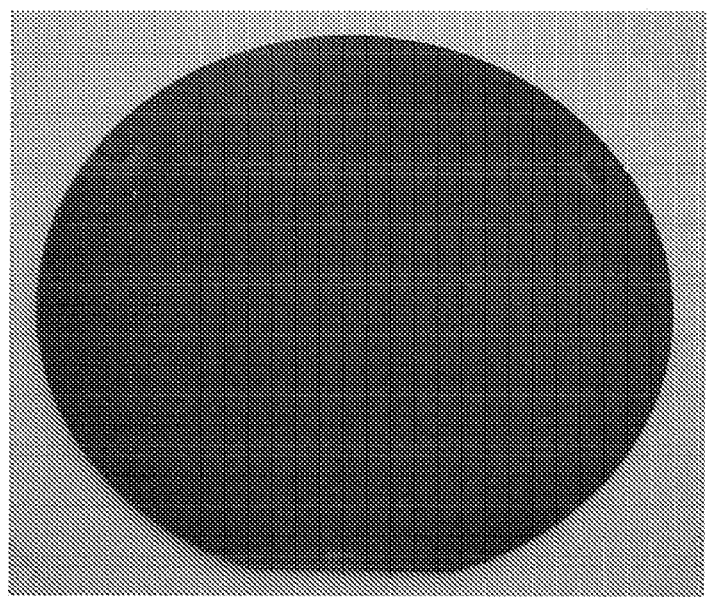
FIG. 2 is a photograph showing a PZT film in Comparative Example for performing comparison with the sample 1 shown in FIG. 1.

FIG. 2 is a photograph showing a conventional PZT film having thickness of 1 μm formed on a 3-inch Si wafer for performing comparison with the sample 1 shown in FIG. 1.

While the ferroelectric film of the sample 1 shown in FIG. 1 has no interference color, the PZT film in Comparative Example shown in FIG. 2 has interference color.

Figure 3:
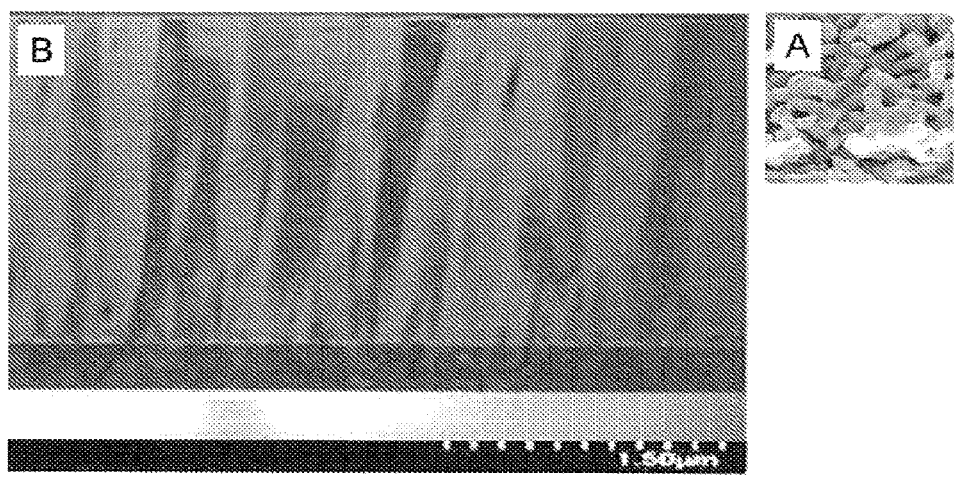
FIG. 3A is a drawing showing a SEM cross-sectional image of the PZT film in Comparative Example shown in FIG. 2.
FIG. 3B is a drawing showing a SEM cross-sectional image of the ferroelectric film of the sample 1 shown in FIG. 1.

FIG. 3A is a drawing showing the SEM cross-sectional image of the PZT film in Comparative Example shown in FIG. 2, and FIG. 3B is a drawing showing the SEM cross-sectional image of the ferroelectric film of the sample 1 shown in FIG. 1.

It can be seen that the PZT film in Comparative Example shown in FIG. 3A has bubbles produced and has poor film quality. In contrast, it can be seen that the ferroelectric film of the sample 1 shown in FIG. 3B has a pillar shape crystal structure or a columnar crystal structure, and, in spite of a thick film having thickness 2 μm, contains almost no bubble to give a very good film quality.

FIG. 4A is a drawing showing the result of measuring a leak current density for the ferroelectric film of the sample 1, FIG. 4B is a drawing showing the result of measuring a leak current density for the ferroelectric film of the sample 2, and FIG. 4C is a drawing showing the result of measuring a leak current density for the ferroelectric film of the sample 3.

As shown in FIGS. 4A to 4C, it was confirmed that each of leak current densities of samples 1 to 3 is $10^{-9}$ A/cm$^2$, $10^{-10}$ A/cm$^2$, and $10^{-10}$ A/cm$^2$, and that each of samples 1 to 3 has an extremely small leak current density.

Next, micro Vickers hardness was measured for each of ferroelectric films of samples 1 to 3, and each was 800 to 1000 Hv.

Next, relative permittivity was measured for each of ferroelectric films of samples 1 to 3, and each was 600 or more.

Figure 6:
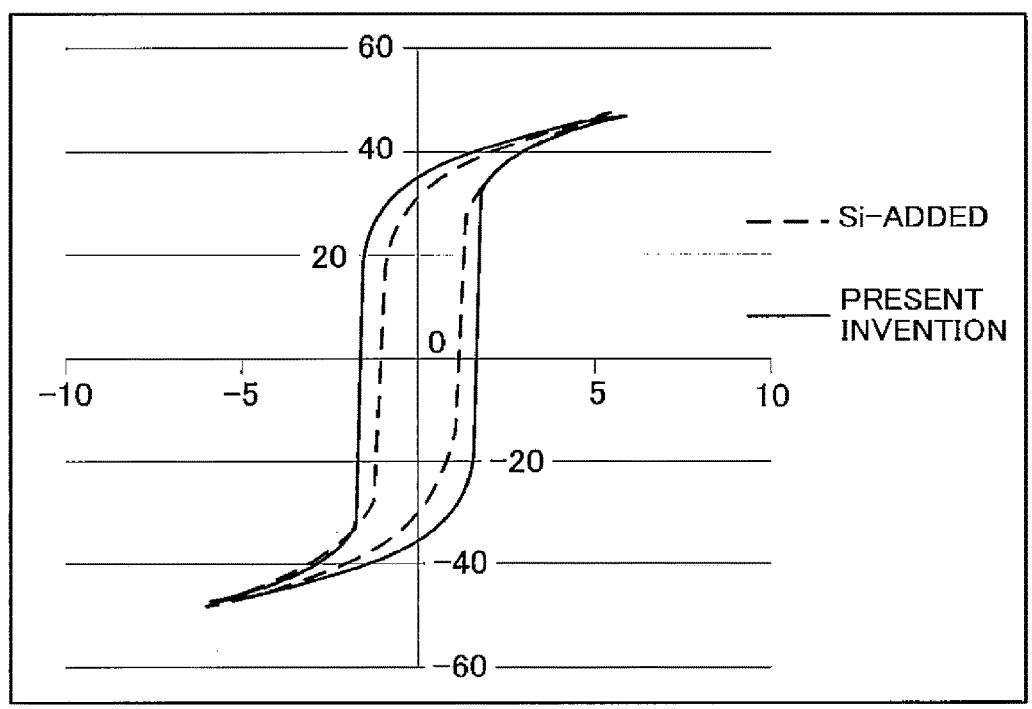
FIG. 6 is a drawing showing the result of performing hysteresis evaluation of the PBNZT ferroelectric film in the Example of the present invention and a conventional PZT to which Si is added.

FIGS. 5 and 6 are drawings showing the result of performing hysteresis evaluation of the PBNZT ferroelectric film in the Example of the present invention and a conventional PZT to which Si is added.

The hysteresis of the present invention shown in FIG. 5 is the hysteresis of the PBNZT ferroelectric film to which Bi 5 mol % and Nb 5 mol % are added. This PBNZT ferroelectric film corresponds to the sample shown in FIG. 3B. The hysteresis of the Si-added PZT of the conventional example shown in FIG. 5 is the hysteresis of PZT to which Si 5 mol % and Nb 5 mol % are added.

The hysteresis of the present invention shown in FIG. 6 is the hysteresis of the PBNZT ferroelectric film to which Bi 10 mol % and Nb 10 mol % are added. The PBNZT ferroelectric film is fabricated by the fabrication method in the Example. The hysteresis of the Si-added PZT of the conventional example shown in FIG. 6 is the hysteresis of the PZT to which Si 5 mol % and Nb 20 mol % are added.

It was confirmed that, as shown in FIGS. 5 and 6, the ferroelectric film of the present invention has an excellent hysteresis property as compared with the conventional Si-added PZT. Meanwhile, the reason why the hysteresis property of the conventional PZT is worse than that of the present invention is considered that Si can not sufficiently perform the function of preventing oxygen ion deficiency, and that the addition of Si deteriorates the ferroelectricity. Hereinafter, detailed explanation will be given.

When the PBNZT (Bi: 5 mol %, Nb: 5 mol %) of the present invention was compared with the conventional example to which Si and Nb are added (Si: 5 mol %, Nb: 5 mol %), in the case of the conventional example, the hysteresis deteriorated largely when Si was added in 2 mol % or more, as shown in FIG. 5. That is, it is considered that Si works as a low permittivity layer to deteriorate the hysteresis property because some percentage of the applied voltage is applied to a low permittivity layer.

Next, according to the present invention, Bi 10 mol % and Nb 10 mol % were added, and, for comparison, since the addition of Nb 20 mol % was effective in the conventional example, Nb 20 mol % and Si 5 mol % were added simultaneously. As the result, as shown in FIG. 6, clear difference appeared. Since the different Nb addition amount resulted in a different anti-electric field, there appeared a large difference in residual polarization value that was also considered as the influence of Si.

Example 2

A raw material solution for forming a PBNZT ferroelectric film having a pH of 6.8, a viscosity of 80 cps and a contact angle of 25° relative to Pt was fabricated by adding raw material liquids as a formula below.

[{(25 mol % PZT sol-gel solution (solvent: ethanol, surplus lead 25%)+5 mol % niobium octylate+5 mol % bismuth octylate+3 mol % manganese octylate+15 mol % dimethyl succinate}+½ volume 2n butoxy ethanol}+⅛ volume (oleic acid 60%+linoleic acid 30%+α-linolenic acid 9%+stearic acid 0.4%+stearoleic acid 0.3%+erucic acid 0.3%)+⅛ volume ethylmethyl ether]+⅕ volume dimethylaminoethanol    (formula)

Meanwhile, "volume" in the above formula means an amount stored in some vessel represented by a volume, which has a unit of cubic meter (m$^3$), litter (l), or the like.

Next, in the same way as in Example 1, a 4-inch or 6-inch Si wafer having a (111)-oriented Pt film formed on the surface is prepared, and the above-mentioned raw material solution for forming PBNZT ferroelectric film is coated on the Si wafer covered with the Pt electrode by a spin-coating method. Consequently, on the Si wafer, a first layer coated film is formed. In detail, the solution 1.5 cc for the 4-inch wafer (3 cc for the 6-inch wafer) was coated, the rotation speed of the coated wafer is increased from 0 to 500 rpm in 3 seconds, the rotation speed of 500 rpm was held for 5 seconds, then the coated wafer was rotated at 1500 rpm for 90 seconds and at 3000 rpm for 30 seconds, and the rotation was stopped.

Next, the first layer coated film was heated and dried at a temperature of 250° C. for 30 seconds by a hot plate, and, after that, was subjected to temporary burning at a temperature of 450° C. for 30 seconds. Consequently, on the Si wafer, a first layer ferroelectric substance material amorphous film having thickness 250 nm was formed.

Subsequently, in the same way as in the first layer coated film, coating, drying and temporary burning were repeated three times to fabricate a 1 μm-PBNZT thick film sample in which a ferroelectric material film having thickness 1 μm including 4 layers was formed.

Furthermore, in the same way as above, a 1.5 μm-PBNZT thick film sample, in which a ferroelectric material film having thickness 1.5 μm including 6 layers was formed, was fabricated, a 2 μm-PBNZT thick film sample, in which a ferroelectric material film having thickness 2 μm including 8 layers was formed, was fabricated, a 3 μm-PBNZT thick film sample, in which a ferroelectric material film having thickness 3 μm including 12 layers was formed, was fabricated, a 4 μm-PBNZT thick film sample, in which a ferroelectric material film having thickness 4 μm including 16 layers was formed, was fabricated, and a 5 μm-PBNZT thick film sample, in which a ferroelectric material film having thickness 5 μm including 20 layers was formed, was fabricated.

Next, by subjecting the ferroelectric material film to a heat treatment by pressurized RTA, the ferroelectric material film is crystallized to form the ferroelectric film. At this time, the heat treatment condition was a temperature increase rate 100° C./sec in a pressurized oxygen atmosphere having an oxygen partial pressure of 9.9 atm, which instantaneously increased the temperature up to 650° C. and held the temperature of 650° C. for 1 minute, thereby crystallizing the ferroelectric material film. Furthermore, the samples were also fabricated, in which the crystallization was performed by change of the holding times to 1.5 minutes, 2 minutes, 3 minutes, 4 minutes and 5 minutes, respectively.

Figure 7A:
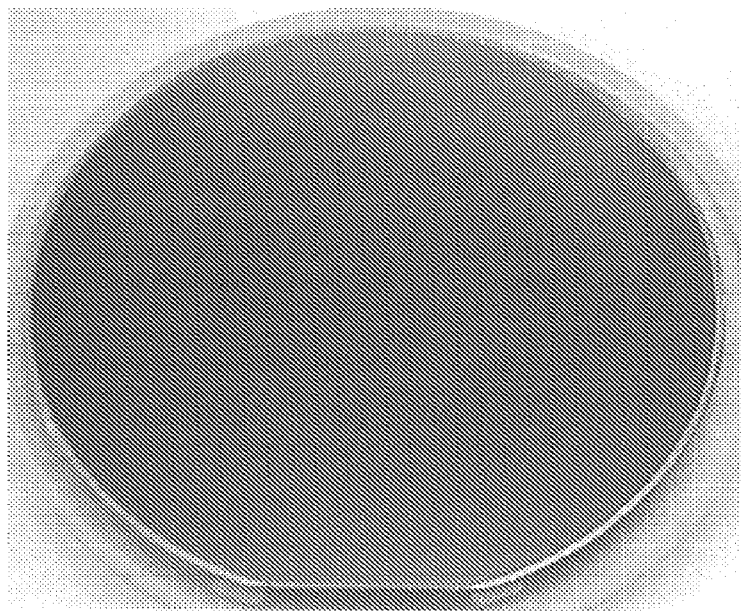
FIG. 7A is a photograph showing a sample of a 5 μm-PBNZT thick film 4-inch wafer.
Figure 7B:
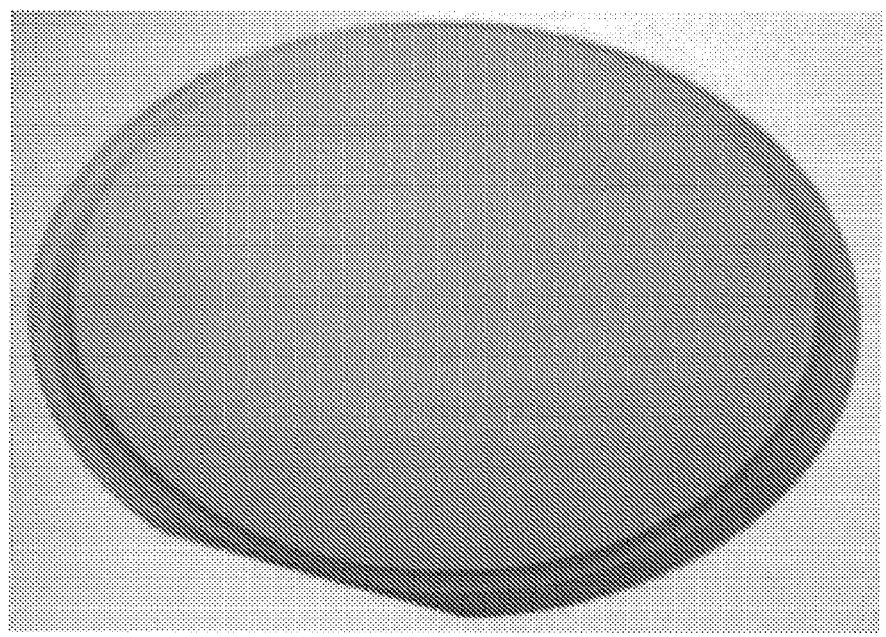
FIG. 7B is a photograph showing a sample of a 1.5 μm-PBNZT thick film 6-inch wafer.

FIG. 7A is a photograph showing the 5 μm-PBNZT thick film 4-inch wafer sample, and FIG. 7B is a photograph showing the 1.5 μm-PBNZT thick film 6-inch wafer sample.

Figure 8:
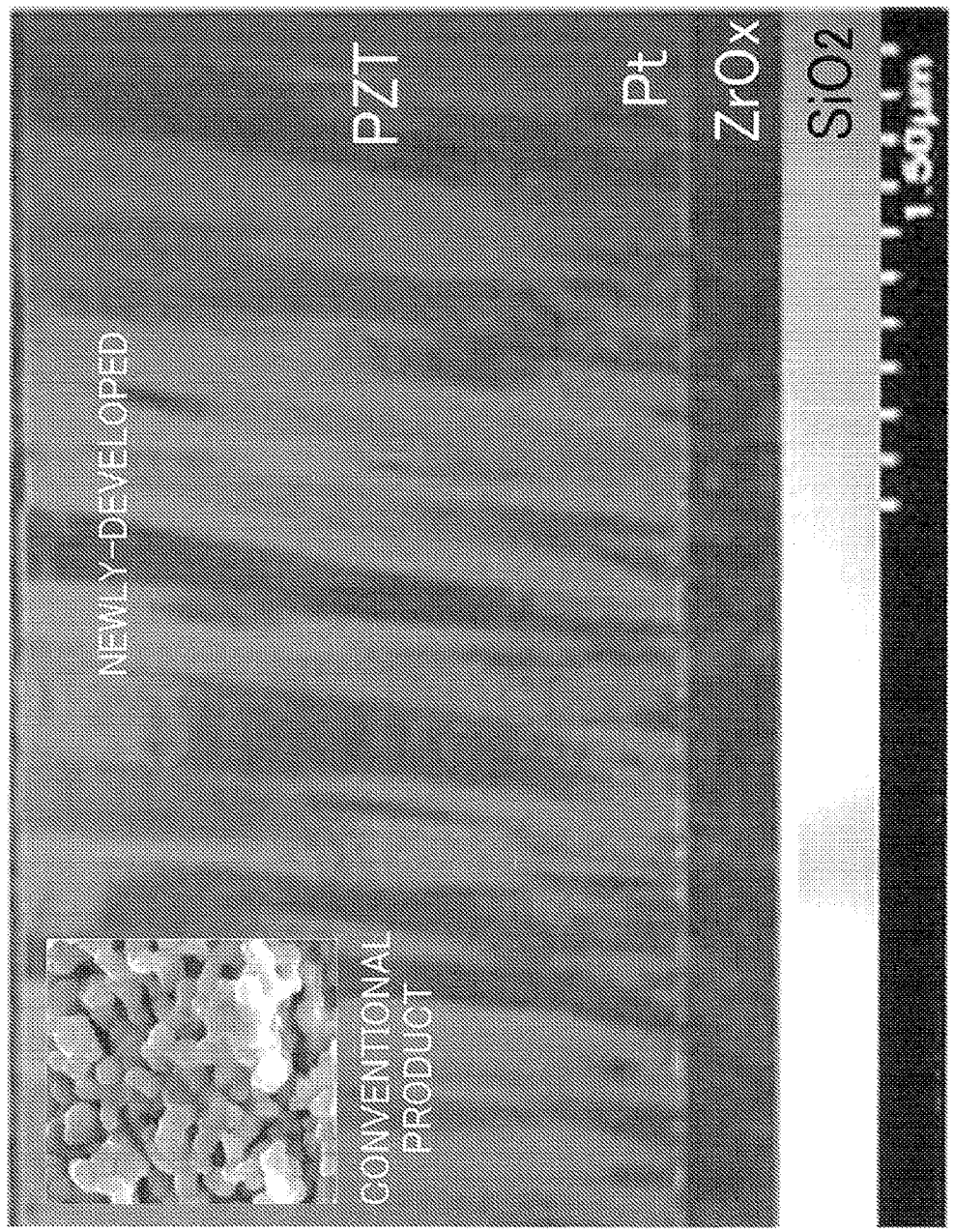
FIG. 8 shows a TEM cross-sectional image of a 2 μm-PBNZT thick film as the drawing denoted by "newly developed," and a TEM cross-sectional image of a PZT film (FIG. 3A) of Comparative Example for Example 1 as the drawing denoted by "a conventional product."

In FIG. 8, the drawing denoted by "newly-developed" is a TEM cross-sectional image of a 2 μm-PBNZT thick film, and the drawing denoted by "conventional product" is a TEM cross-sectional image of the PZT film (FIG. 3A) in Comparative Example relative to Example 1.

It can be seen that air bubbles has entered into the conventional product in FIG. 8, which has poor film quality. In contrast, it can be seen that the ferroelectric film shown by "newly-developed" shown in FIG. 8 has a pillar shape crystal structure or a columnar crystal structure, and, in spite of a thick film having thickness 2 μm, contains almost no bubble to give a very good film quality.

Figure 9A:
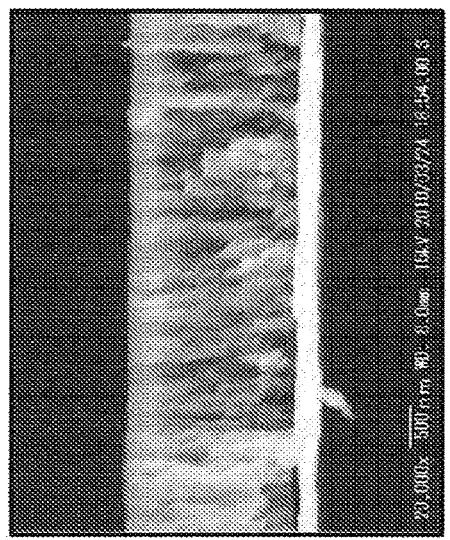
FIG. 9A is a drawing showing a SEM cross-sectional image of a 1 μm-PBNZT thick film.
Figure 9B:
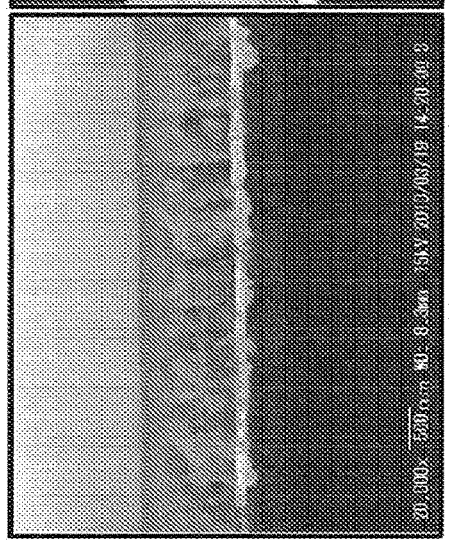
FIG. 9B is a drawing showing a SEM cross-sectional image of a 1.5 μm-PBNZT thick film.
Figure 9C:
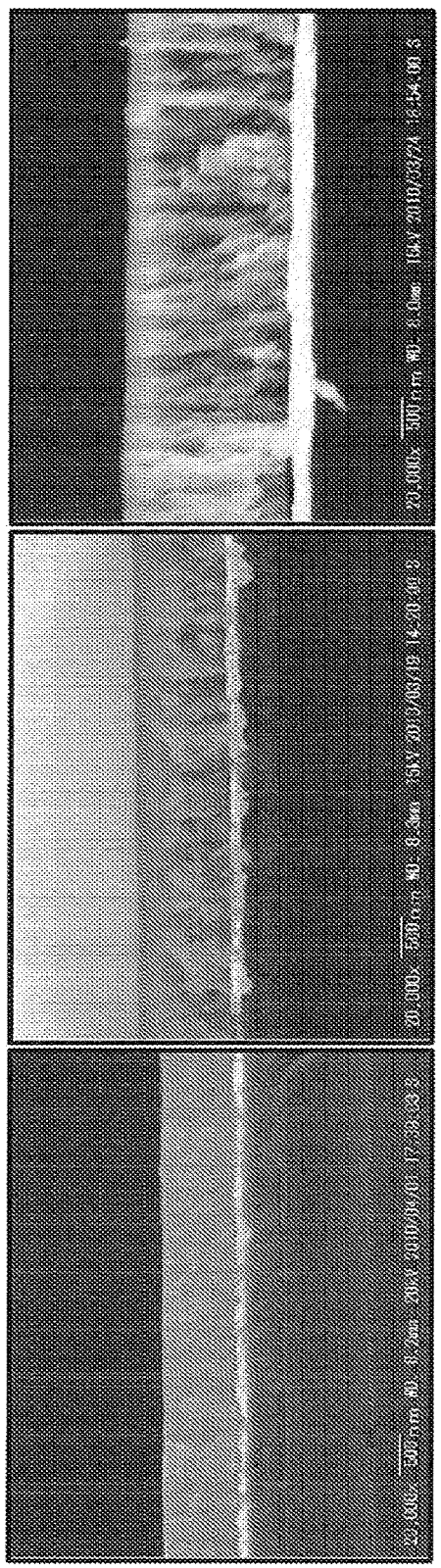
FIG. 9C is a drawing showing a SEM cross-sectional image of a 2 μm-PBNZT thick film.
Figure 9D:
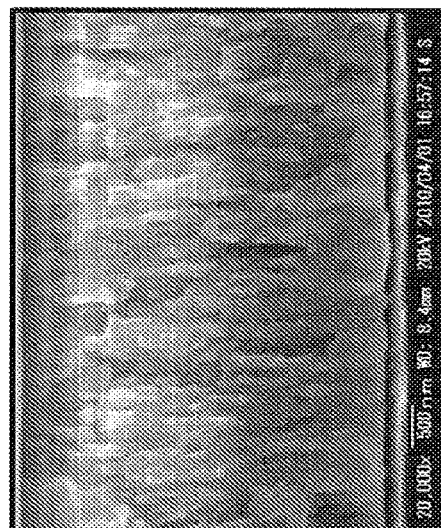
FIG. 9D is a drawing showing a SEM cross-sectional image of a 3 μm-PBNZT thick film.
Figure 9E:
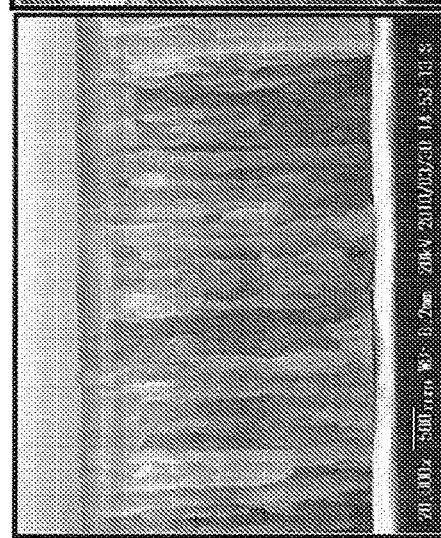
FIG. 9E is a drawing showing a SEM cross-sectional image of a 4 μm-PBNZT thick film.
Figure 9F:
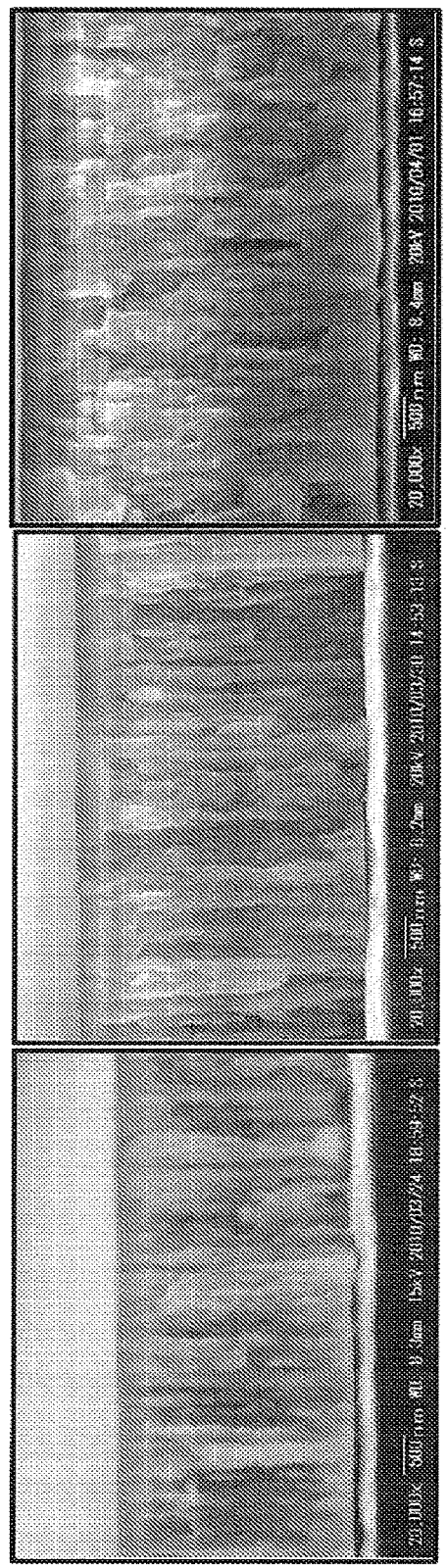
FIG. 9F is a drawing showing a SEM cross-sectional image of a 5 μm-PBNZT thick film.

FIG. 9A is a drawing showing a SEM cross-sectional image of the 1 μm-PBNZT thick film, FIG. 9B is a drawing showing a SEM cross-sectional image of the 1.5 μm-PBNZT thick film, FIG. 9C is a drawing showing a SEM cross-sectional image of the 2 μm-PBNZT thick film, FIG. 9D is a drawing showing a SEM cross-sectional image of the 3 μm-PBNZT thick film, FIG. 9E is a drawing showing a SEM cross-sectional image of the 4 μm-PBNZT thick film, and FIG. 9F is a drawing showing a SEM cross-sectional image of the 5 μm-PBNZT thick film.

Figure 10B:
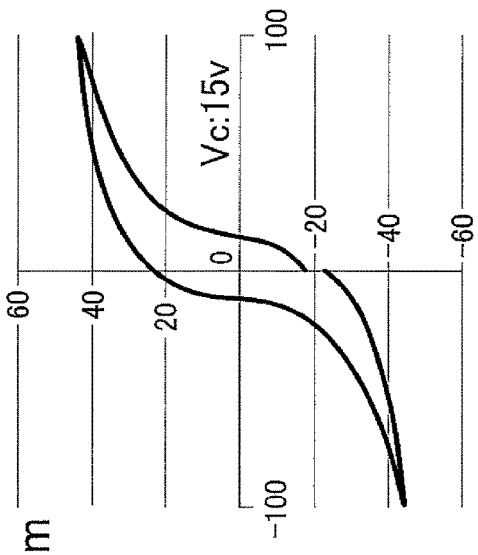
FIG. 10B is a drawing showing a result of performing the hysteresis evaluation of a 4 μm-PBNZT thick film.
Figure 10A:
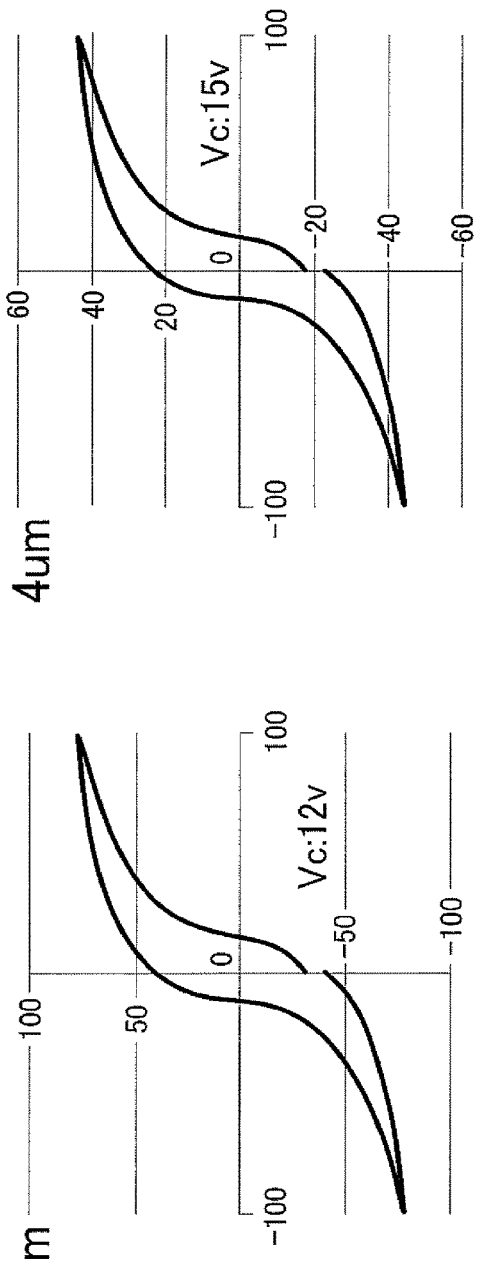
FIG. 10A is a drawing showing a result of performing the hysteresis evaluation of a 3 μm-PBNZT thick film.
Figure 10C:
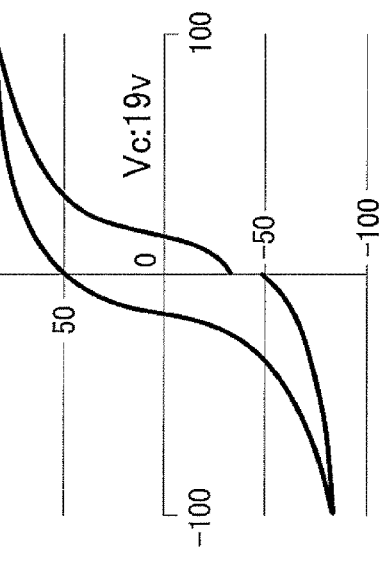
FIG. 10C is a drawing showing a result of the hysteresis evaluation of a 5 μm-PBNZT thick film.

FIG. 10A is a drawing showing a result of performing the hysteresis evaluation of the 3 μm-PBNZT thick film, FIG. 10B is a drawing showing a result of performing the hysteresis evaluation of the 4 μm-PBNZT thick film, and FIG. 10C is a drawing showing a result of performing the hysteresis evaluation of the 5 μm-PBNZT thick film.

As shown in FIGS. 10A to 10C, it was confirmed that the ferroelectric film of the present invention has an excellent hysteresis property.

Evaluation results of the property of the PBNZT thick film of the Example were as follows. From the results, it was confirmed that properties of the PBNZT thick film of the Example are extremely excellent even when they are compared with properties of the 3 μm-Pb($Zr_{0.52}Ti_{0.48}$)$O_3$.

[1] Evaluation Results
  d33=470 pm/V
  d31=148 pm/V
  Poisson's ratio=0.31
  tan δ≤0.01
  Tc 350° C.

Meanwhile, the d constant is the coefficient representing the degree of displacement when a electric field (V/m) is applied to a piezoelectric material. "d" means the d of Displacement. Depending on the relation between the electric field direction and the displacement direction, it is represented by d33, d31 [unit: m/V, C/N] or the like. Usually, the axis having been subjected to a polarization treatment is represented as 3, other axes are represented as 1, 2, and independent d constants in ceramics having been subjected to a polarization treatment are represented as d31, d33. That is, d33 means a mechanical displacement proportion per the electric field in the 33 direction, and d31 means a mechanical displacement proportion per the electric field in the 31 direction. When an alternating electric field E is applied to a dielectric substance, actually, a part of the electric energy is lost as heat. As a scale showing the loss, generally, the dielectric loss (tan δ) is employed. The dielectric loss is occasionally expressed as a dielectric loss coefficient or "tangent of the dielectric loss." Here, δ shows the delay of phase of electric polarization relative to the alternating electric field, that is, means the loss angle. Actually, tan δ is used as a rough estimate showing the quality of a dielectric substance, and, generally, it is possible to think that heat generation of a condenser is suppressed when the value is small. Usually, it is expressed as a form of tan δ=0.03, or 3%.

Example 3

A raw material solution for forming a PBNZT ferroelectric film having pH 6.5, viscosity of 40 cps and a contact angle 10° relative to Pt was fabricated by adding raw material liquids as a formula below.

[{(25 mol % PZT sol-gel solution (solvent: ethanol, surplus lead 25%)+5 mol % niobium octylate+5 mol % bismuth octylate+3 mol % manganese octylate+15 mol % dimethyl succinate)+½ volume 2n butoxy ethanol}+⅛ volume (lauric acid 45%+myristic acid 18%+palmitic acid 10%+caprylic acid 8%+oleic acid 8%+capric acid 7%+stearic acid 2%+linoleic acid 2%)+⅛ volume ethylmethyl ether]+⅕ volume dimethylaminoethanol     (formula)

Next, in the same way as in Example 1, a 4-inch or 6-inch Si wafer having a (111)-oriented Pt film formed on the surface is prepared, and the above-mentioned raw material solution for forming PBNZT ferroelectric film is coated on the Si wafer covered with the Pt electrode by a spin-coating method. Consequently, on the Si wafer, a first layer coated film is formed. In detail, the solution 1.5 cc for the 4-inch wafer was coated, the rotation speed of the coated wafer is increased from 0 to 500 rpm in 3 seconds, the rotation speed of 500 rpm was held for 5 seconds, then the coated wafer was rotated at 1000 rpm for 90 seconds and at 3000 rpm for 30 seconds, and the rotation was stopped.

Next, the first layer coated film was heated and dried at a temperature of 250° C. for 30 seconds by a hot plate, and, after that, was subjected to temporary burning at a temperature of 450° C. for 30 seconds. Consequently, on the Si wafer, a first layer ferroelectric substance material amorphous film was formed.

Subsequently, in the same way as in the first layer coated film, coating, drying and temporary burning were repeated five times to fabricate a 1 μm-PBNZT thick film sample in which a ferroelectric material film having thickness 1 μm including 6 layers was formed.

Next, by subjecting the ferroelectric material film to a heat treatment by pressurized RTA, the ferroelectric material film is crystallized to form the ferroelectric film. At this time, the heat treatment condition was a temperature increase rate 100° C./sec in a pressurized oxygen atmosphere having an oxygen partial pressure of 9.9 atm, which instantaneously increased the temperature up to 650° C. and held the temperature of 650° C. for 1 minute, thereby crystallizing the ferroelectric material film. Furthermore, the samples were also fabricated, in which the oxygen partial pressure was changed to 5 atm and 7.5 atm, respectively.

FIGS. 11A to 11C are drawings showing results of evaluating the crystallinity of the PBNZT thick film of the Example by XRD diffraction.

FIG. 11A shows the result of the sample on which the crystallization was performed in a pressurized oxygen atmosphere having an oxygen partial pressure of 9.9 atm, and it was confirmed that, in the sample, the orientation can be controlled to (001). FIG. 11B shows the result of the sample on which the crystallization was performed in a pressurized oxygen atmosphere having an oxygen partial pressure of 5 atm, and it was confirmed that, in the sample, the orientation can be controlled to (110). FIG. 11C shows the result of the sample on which the crystallization was performed in a pressurized oxygen atmosphere having an oxygen partial pressure of 7.5 atm, and it was confirmed that, in the sample, the orientation can be controlled to (111).

From the results shown in FIGS. 11A to 11C, it is known that the orientation can be controlled depending on the oxygen partial pressure in crystallization even on a Pt (111) substrate, and it becomes possible to obtain optimum properties by controlling the orientation for every device to which the PBNZT thick film is applied.

Figure 12:
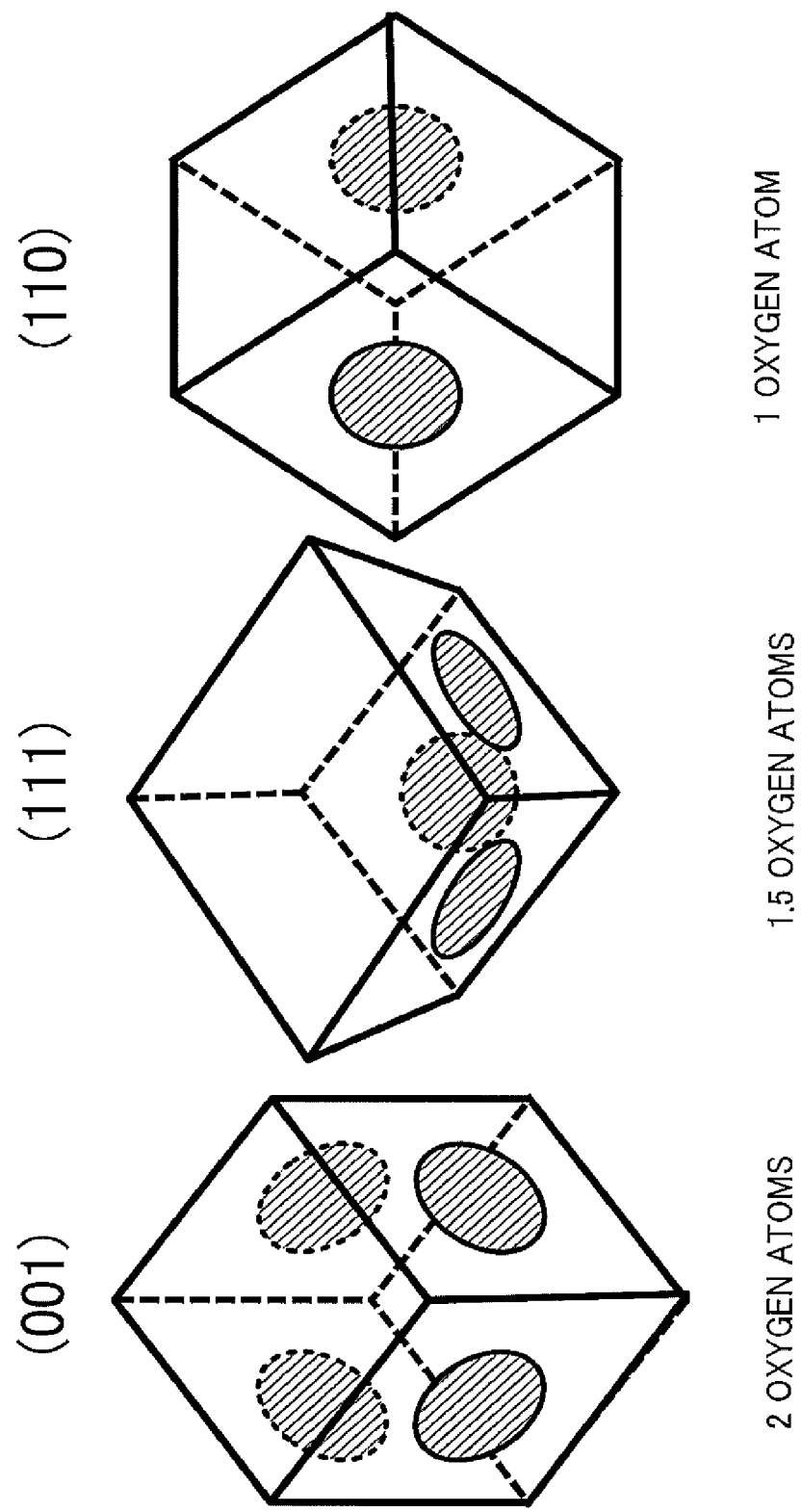
FIG. 12 is a schematic view showing crystals of PBNZT thick films oriented in (001), (111) and (110), respectively.

FIG. 12 is a schematic view showing the crystal of PBNZT thick films oriented to (001), (111), (110), respectively. As shown in FIG. 12, it is known that the number of oxygen per the crystal of the PBNZT thick film crystallized at an oxygen partial pressure of 9.9 atm to be oriented to (001) is 2, that the number of oxygen per the crystal of the PBNZT thick film crystallized at an oxygen partial pressure of 7.5 atm to be oriented to (111) is 1.5, and that the number of oxygen per the crystal of the PBNZT thick film crystallized at an oxygen partial pressure of 5 atm to be oriented to (110) is 1.

FIG. 11D is a drawing showing a result of performing hysteresis evaluation of the PBNZT thick film in FIG. 11A, FIG. 11E is a drawing showing a result of performing hysteresis evaluation of the PBNZT thick film in FIG. 11B, and FIG. 11F is a drawing showing a result of performing hysteresis evaluation of the PBNZT thick film in FIG. 11C.

As shown in FIGS. 11D to 11F, it was confirmed that the ferroelectric film of the present invention has an excellent hysteresis property.

The invention claimed is:

1. A sol-gel solution for forming a PBNZT ferroelectric film on a substrate, wherein said sol-gel solution comprises a raw material solution comprising a hydrolysis polycondensation reaction product of an alkoxide raw material, and has a contact angle of 1 to not more than 40° with respect to the substrate,
wherein the alkoxide raw material comprises Pb, Bi, Nb, Zr and Ti.

2. The sol-gel solution according to claim 1, wherein said contact angle with respect to the substrate is 1 to not more than 20°.

3. The sol-gel solution according to claim 1, wherein said sol-gel solution includes a polycarboxylic acid or a polycarboxylic acid ester in the solvent.

4. The sol-gel solution according to claim 3, wherein said polycarboxylic acid ester includes heteropolyacid ions.

5. The sol-gel solution according to claim 4, wherein said heteropolyacid ion has a Keggin type structure of the Formula:

$$[XM_yM'_{12-y}O_{40}]^{n-},$$

where X is a hetero atom, M is a polyatom, M' is a polyatom different from M, n is a valence number, and y=1 to 11.

6. The sol-gel solution according to claim 4, wherein said heteropolyacid ion has a Keggin type structure of the Formula:

$$[XM_{11}O_{39}]^{n-},$$

where X is a hetero atom, M is a polyatom, and n is a valence number.

7. The sol-gel solution according to claim 4, wherein said heteropolyacid ion has a Keggin type structure of the Formula:

$$[XM_zM'_{11-z}O_{39}]^{n-},$$

where X is a hetero atom, M is a polyatom, M' is a polyatom different from M, n is a valence number, and z=1 to 10.

8. The sol-gel solution according to claim 4, wherein the sol-gel solution includes, among said heteropolyacid ions, heteropolyacid ions in which the hetero atom includes the group consisting of B, Si, P, S, Ge, As, Mn, Fe and Co, and the polyatom includes the group consisting of Mo, V, W, Ti, Al, Nb and Ta, as a part of a precursor structure of a ferroelectric ceramics.

9. The sol-gel solution according to claim 1, wherein the sol-gel solution includes at least one of a high viscosity polyhydric alcohol, glycol ethers, a lower alcohol or a basic alcohol in the solvent.

10. The sol-gel solution according to claim 1, wherein:
said PBNZT ferroelectric film includes a perovskite-structured ferroelectric substance of the Formula:

$$(Pb_{1-X}Bi_X)((TiZr)_{1-Y}Nb_Y)O_3,$$

wherein X is 1 to 10 mol %;
Y is 1 to 10 mol %; and
the surplus lead addition amount included in said raw material solution is 15 mol % or more.

11. The sol-gel solution according to claim 1, wherein said sol-gel solution includes polar solvents.

12. The sol-gel solution according to claim 11, wherein said polar solvent is any one of methyl ethyl ketone, 1,4-dioxane, 1,2-dimethoxyethane acetamide, N-methyl-2-pyrrolidone, acetonitrile, dichloromethane, nitromethane, trichloromethane, dimethylformamide, monomethylformamide, or combinations thereof.

13. The sol-gel solution according to claim 2, wherein said sol-gel solution includes an unsaturated fatty acid, wherein:
said unsaturated fatty acid is any one of monounsaturated fatty acid, diunsaturated fatty acid, triunsaturated fatty acid, tetraunsaturated fatty acid, pentaunsaturated fatty acid, hexaunsaturated fatty acid, or combinations thereof;
said monounsaturated fatty acid is any one of crotonic acid, myristoleic acid, palmitoleic acid, oleic acid, elaidic acid, vaccenic acid, gadoleic acid, eicosenoic acid, erucic acid, nervonic acid, or combinations thereof;
said diunsaturated fatty acid is any one of linoleic acid, eicosadienoic acid, docosadienoic acid, or combinations thereof;
said triunsaturated fatty acid is any one of linolenic acid, pinolenic acid, eleostearic acid, mead acid, dihomo-γ-linolenic acid, eicosatrienoic acid, or combinations thereof;
said tetraunsaturated fatty acid is any one of stearidonic acid, arachidonic acid, eicosatetraenoic acid, adrenic acid, or combinations thereof;
said pentaunsaturated fatty acid is any one of bosseopentaenoic acid, eicosapentaenoic acid, osbond acid, clupanodonic acid, tetracosapentaenoic acid, or combinations thereof; and
said hexaunsaturated fatty acid is any one of docosahexaenoic acid, nisinic acid, or combinations thereof.

14. A method for producing a ferroelectric film, wherein the sol-gel solution according to claim 1 is used for production of a PBNZT ferroelectric film that is a ferroelectric film comprising a perovskite-structured
ferroelectric substance represented by $ABO_3$, wherein:
said perovskite-structured ferroelectric substance is a PZT-based ferroelectric substance containing $Pb^{2+}$ as A-site ions and containing $Zr^{4+}$ and $Ti^{4+}$ as B-site ions;
the A-site contains $Bi^{3+}$ as A-site compensation ions;
the B-site contains $Nb^{5+}$ as B-site compensation ions;
the content of said A-site compensation ions is 5 to 10 mol % relative to the stoichiometric composition of said perovskite-structured ferroelectric substance; and
the content of said B-site compensation ions is 5 to 10 mol % relative to the stoichiometric composition of said perovskite-structured ferroelectric substance.

15. A method for producing a ferroelectric film, wherein the sol-gel solution according to claim 1 is used for production of a ferroelectric film having a relative permittivity of 400 or more.

16. A film forming method, comprising the steps of:
coating the sol-gel solution according to claim 1 on a substrate to form a coated film on said substrate;
temporarily burning said coated film; and
repeating the formation of said coated film and said temporary burning a plurality of times to form a ferroelectric material film including a plurality of coated films on said substrate.

17. The film forming method according to claim 16, wherein:
said ferroelectric material film has a thickness of more than 300 nm; and
said ferroelectric material film is subjected to a heat treatment to crystallize collectively said ferroelectric material film.

18. A method for producing a ferroelectric film comprising the steps of:
forming a ferroelectric material film on a substrate by using the film forming method according to claim 16; and
heat-treating said ferroelectric material film to form a ferroelectric film including a perovskite-structured ferroelectric substance obtained by crystallizing said ferroelectric material film, wherein
said ferroelectric film is a PBNZT ferroelectric film that is a ferroelectric film comprising a perovskite-structured ferroelectric substance represented by $ABO_3$, wherein:
said perovskite-structured ferroelectric substance is a PZT-based ferroelectric substance containing $Pb^{2+}$ as A-site ions and containing $Zr^{4+}$ and $Ti^{4+}$ as B-site ions;
the A-site contains $Bi^{3+}$ as A-site compensation ions;
the B-site contains $Nb^{5+}$ as B-site compensation ions;
the content of said A-site compensation ions is 5 to 10 mol % relative to the stoichiometric composition of said perovskite-structured ferroelectric substance; and
the content of said B-site compensation ions is 5 to 10 mol % relative to the stoichiometric composition of said perovskite-structured ferroelectric substance.

19. A method for producing a ferroelectric film comprising the steps of:
forming a ferroelectric material film on a substrate, by using the film forming method according to claim 16; and
heat-treating said ferroelectric material film to form, on the substrate, a ferroelectric film having a relative permittivity of 400 or more obtained by crystallizing said ferroelectric material film.

20. The method for producing a ferroelectric film according to claim 17, wherein, when a ferroelectric material film is formed on said substrate, the formation of said coated film and said temporary burning are repeated a plurality of times to form a ferroelectric material film including the plurality of coated films on said substrate.

21. The method for producing a ferroelectric film according to claim 18, wherein the surface of said substrate has a (111)-oriented Pt or Ir film.

\* \* \* \* \*